US012812990B2

(12) United States Patent
Yoshigiwa et al.

(10) Patent No.: US 12,812,990 B2
(45) Date of Patent: Nov. 24, 2026

(54) IMAGING DEVICE AND MANUFACTURING METHOD FOR IMAGING DEVICE

(71) Applicant: SONY SEMICONDUCTOR SOLUTIONS CORPORATION, Kanagawa (JP)

(72) Inventors: Jun Yoshigiwa, Kanagawa (JP); Tomoki Hirano, Kanagawa (JP); Suguru Saito, Kanagawa (JP); Rikiichi Oono, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 414 days.

(21) Appl. No.: 18/551,613

(22) PCT Filed: Mar. 4, 2022

(86) PCT No.: PCT/JP2022/009354
§ 371 (c)(1),
(2) Date: Sep. 21, 2023

(87) PCT Pub. No.: WO2022/209580
PCT Pub. Date: Oct. 6, 2022

(65) Prior Publication Data

US 2024/0170507 A1 May 23, 2024

(30) Foreign Application Priority Data

Mar. 31, 2021 (JP) ................................. 2021-059847

(51) Int. Cl.
*H10F 39/00* (2025.01)
*H04N 25/78* (2023.01)
(Continued)

(52) U.S. Cl.
CPC ........... *H10F 39/802* (2025.01); *H04N 25/79* (2023.01); *H10F 39/011* (2025.01);
(Continued)

(58) Field of Classification Search
CPC .... H10F 39/802; H10F 39/011; H10F 39/182; H10F 39/8027; H10F 39/8057;
(Continued)

(56) References Cited

U.S. PATENT DOCUMENTS

2004/0056560 A1* 3/2004 Wang ................. H03H 9/02133 310/311
2013/0099291 A1* 4/2013 Shimotsusa ........... H10F 39/803 438/57
(Continued)

FOREIGN PATENT DOCUMENTS

JP 2002124474 A * 4/2002
JP 2005-539463 A 12/2005
(Continued)

OTHER PUBLICATIONS

Yamauchi et al. (JP 2002124474 A with machine translation-Yamauchi74) (Year: 2002).*
(Continued)

*Primary Examiner* — Christine S. Kim
*Assistant Examiner* — Nathalie R Fayette
(74) *Attorney, Agent, or Firm* — CHIP LAW GROUP

(57) ABSTRACT

There is provided an imaging device which includes a first semiconductor substrate, a plurality of sensor pixels that is provided on the first semiconductor substrate and performs photoelectric conversion, and a trench provided in a depth direction of the first semiconductor substrate from a first main surface of the first semiconductor substrate. The first
(Continued)

semiconductor substrate is a substrate in which the first main surface is a first plane. At least a part of a side surface of the trench is a second plane.

13 Claims, 26 Drawing Sheets

(51) Int. Cl.
*H04N 25/79* (2023.01)
*H10F 39/18* (2025.01)

(52) U.S. Cl.
CPC ....... *H10F 39/182* (2025.01); *H10F 39/8027* (2025.01); *H10F 39/8057* (2025.01); *H10F 39/806* (2025.01); *H10F 39/807* (2025.01); *H10F 39/809* (2025.01); *H04N 25/78* (2023.01)

(58) Field of Classification Search
CPC .... H10F 39/806; H10F 39/807; H10F 39/809; H10F 39/199; H10F 39/12; H10F 39/8053; H10F 39/8063; H10F 39/811; H04N 25/79; H04N 25/78; H10W 10/00; H10W 10/01
See application file for complete search history.

(56) References Cited

U.S. PATENT DOCUMENTS

2018/0302597 A1* 10/2018 Honda ..................... H04N 9/77
2022/0223642 A1* 7/2022 Hoshi ................. H10F 39/8057
2022/0399391 A1* 12/2022 Yoshimoto ............. H04N 25/70

FOREIGN PATENT DOCUMENTS

JP 2012-015274 A 1/2012
JP 2013-175494 A 9/2013
JP 2014-130922 A 7/2014
JP 2017-005111 A 1/2017
JP 2019-046960 A 3/2019
WO 2020/095674 A1 5/2020

OTHER PUBLICATIONS

International Search Report and Written Opinion of PCT Application No. PCT/JP2022/009354, issued on May 31, 2022, 11 pages of ISRWO.

* cited by examiner

IMAGING DEVICE AND MANUFACTURING METHOD FOR IMAGING DEVICE

CROSS REFERENCE TO RELATED APPLICATIONS

This application is a U.S. National Phase of International Patent Application No. PCT/JP2022/009354 filed on Mar. 4, 2022, which claims priority benefit of Japanese Patent Application No. JP 2021-059847 filed in the Japan Patent Office on Mar. 31, 2021. Each of the above-referenced applications is hereby incorporated herein by reference in its entirety.

TECHNICAL FIELD

The present disclosure relates to an imaging device and a manufacturing method for an imaging device.

BACKGROUND ART

An imaging device including a photoelectric conversion unit provided on a substrate and an element isolation portion provided on the substrate and surrounding the photoelectric conversion unit is known (see, for example, Patent Document 1).

CITATION LIST

Patent Document

Patent Document 1: Japanese Patent Application Laid-Open No. 2013-175494

SUMMARY OF THE INVENTION

Problems to be Solved by the Invention

In the step of forming the element isolation portion, the substrate is dry-etched in a depth direction to form a trench. The dry etching may cause physical damage (for example, crystal defects) to a side surface and a bottom surface of the trench. Crystal defects cause dark current and white spots.

The present disclosure has been made in view of such circumstances, and an object thereof is to provide an imaging device and a manufacturing method for the imaging device capable of reducing dark current and white spots.

Solutions to Problems

An imaging device according to an aspect of the present disclosure includes a first semiconductor substrate, a plurality of sensor pixels that is provided on the first semiconductor substrate and performs photoelectric conversion, and a trench provided in a depth direction of the first semiconductor substrate from a first main surface of the first semiconductor substrate. The first semiconductor substrate is a (110) substrate in which the first main surface is a (110) plane. At least a part of a side surface of the trench is a (111) plane.

With this configuration, a trench in which at least a part of the side surface is the (111) plane can be formed by performing crystal anisotropic etching in which the (110) plane is easily etched and the (111) plane is hardly etched on the first main surface of the first semiconductor substrate. The crystal anisotropic etching described above can be performed by wet etching using an alkaline solution. In the wet etching using the alkaline solution, the etching chemically proceeds, so that it is possible to suppress occurrence of crystal defects on the side surface of the trench as compared with dry etching. Thus, the imaging device can reduce dark current and white spots caused by crystal defects.

An imaging device according to another aspect of the present disclosure includes a first semiconductor substrate including a plurality of sensor pixels that performs photoelectric conversion, and an inter-pixel isolation portion that separates one sensor pixel and another sensor pixel adjacent to each other among the plurality of sensor pixels. The first semiconductor substrate is a (110) substrate in which a first main surface is a (110) plane. A shape of each of the plurality of sensor pixels in plan view is a rhombus.

With this configuration, the side surface of the trench of the pixel isolation portion arranged between the pixels of the sensor pixel can be the (111) plane. The trench whose side surface is the (111) plane can be formed by performing crystal anisotropic etching in which the (110) plane is easily etched and the (111) plane is hardly etched on the first main surface of the first semiconductor substrate. As in a case of the imaging device according to the above aspect, in the wet etching using the alkaline solution, the etching chemically proceeds, so that it is possible to suppress occurrence of crystal defects on the side surface of the trench as compared with dry etching. Thus, the imaging device can reduce dark current and white spots caused by crystal defects.

A manufacturing method for an imaging device according to an aspect of the present disclosure includes a step of forming a trench in a depth direction of a first semiconductor substrate from a first main surface of the first semiconductor substrate on which a plurality of sensor pixels that performs photoelectric conversion is provided. The first semiconductor substrate is a (110) substrate in which the first main surface is a (110) plane. In the step of forming the trench, the first semiconductor substrate is etched along a (111) plane. In this manner, the above-described imaging device can be manufactured.

MODE FOR CARRYING OUT THE INVENTION

Hereinafter, an embodiment of the present disclosure is described with reference to the drawings. In the illustration of the drawings referred to in the following description, the same or similar portions are denoted by the same or similar reference signs. It should be noted that the drawings are schematic, and a relationship between a thickness and a planar dimension, a ratio of the thicknesses between layers, and the like are different from actual ones. Therefore, specific thicknesses and dimensions should be determined in consideration of the following description. Furthermore, it goes without saying that dimensional relationships and ratios are partly different between the drawings.

In addition, the definitions of directions such as up and down or the like in the following description are merely definitions for convenience of description, and do not limit the technical idea of the present disclosure. For example, it is a matter of course that when an object is observed by rotating the object by 90°, the up and down are converted into and read as left and right, and when the object is observed by rotating the object by 180°, the up and down are inverted and read.

Furthermore, in the following description, the direction is sometimes described using terms such as an X-axis direction, a Y-axis direction, and a Z-axis direction. For example, the X-axis direction and the Y-axis direction are directions parallel to a front surface 11*a* of a first semiconductor substrate 11 described later. The Z-axis direction is a direction orthogonal to the front surface 11*a* of the first semiconductor substrate 11 and is also a thickness direction of the first semiconductor substrate 11. The X-axis direction, the Y-axis direction, and the Z-axis direction are orthogonal to each other. Furthermore, in the following description, a plan view means viewing from the Z-axis direction.

Furthermore, in the following description, + and − may be added to p and n indicating the conductivity type of a semiconductor region. The semiconductor region to which + or − is added means that an impurity concentration thereof is relatively higher or lower than that of the semiconductor region to which + and − are not added. However, even in the semiconductor regions to which the same p and p (or n and n) are added, it does not mean that the impurity concentrations of the semiconductor regions are exactly the same.

First Embodiment

Overall Configuration Example

Figure 1:
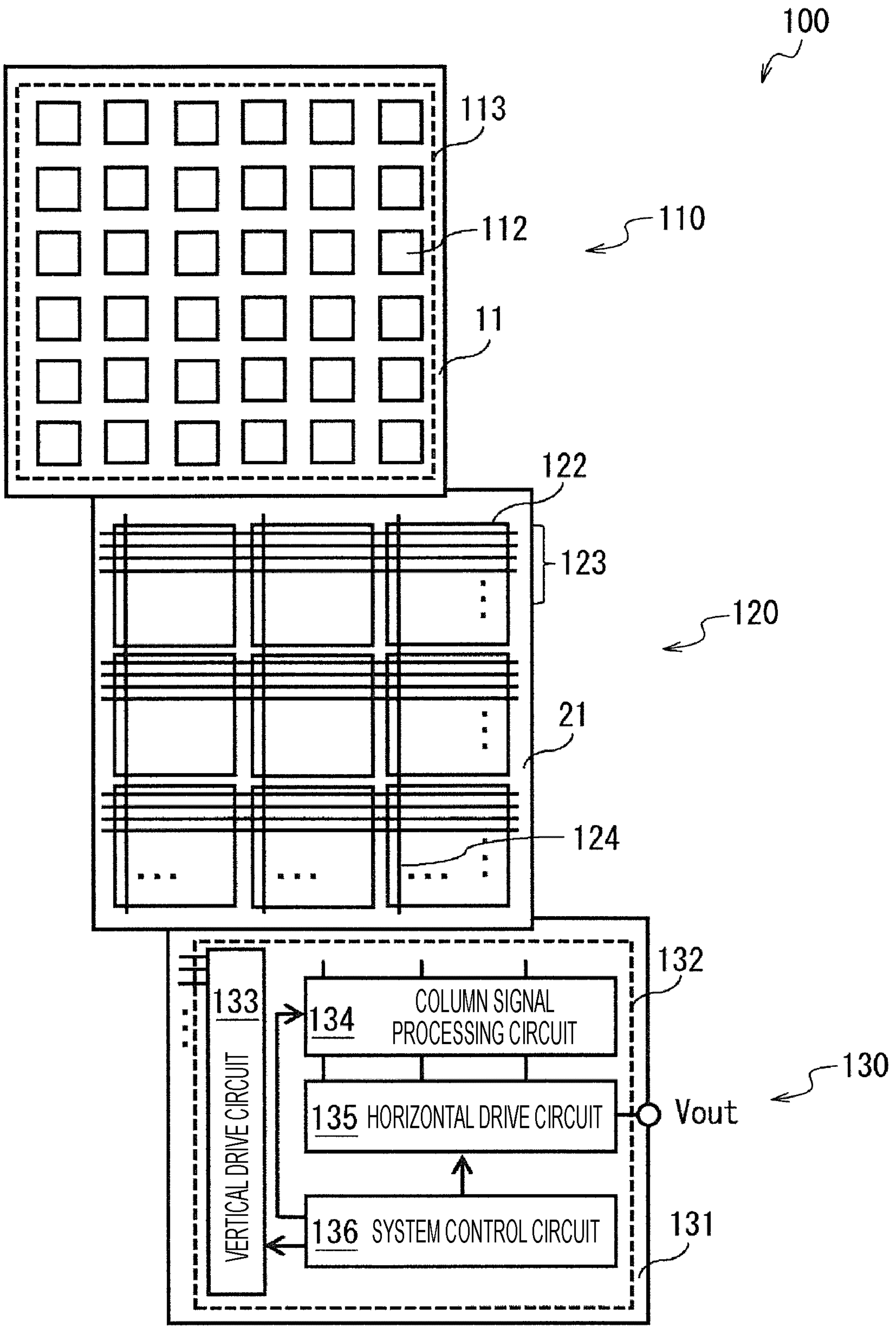
FIG. 1 is a schematic diagram illustrating a configuration example of an imaging device according to a first embodiment of the present disclosure.

FIG. 1 is a schematic diagram illustrating a configuration example of an imaging device 100 according to a first embodiment of the present disclosure. The imaging device 100 includes a first substrate unit 110, a second substrate unit 120, and a third substrate unit 130. The imaging device 100 is an imaging device having a three-dimensional structure formed by bonding the first substrate unit 110, the second substrate unit 120, and the third substrate unit 130. The first substrate unit 110, the second substrate unit 120, and the third substrate unit 130 are stacked in this order.

The first substrate unit 110 includes a first semiconductor substrate 11 and a plurality of sensor pixels 112 provided on the first semiconductor substrate 11. The plurality of sensor pixels 112 performs photoelectric conversion. The plurality of sensor pixels 112 is provided in a matrix in the pixel region 113 of the first substrate unit 110. The second substrate unit 120 includes a second semiconductor substrate 21, a readout circuit 122 provided on the second semiconductor substrate 21, a plurality of pixel drive lines 123 provided on the second semiconductor substrate 21 and extending in a row direction, and a plurality of vertical signal lines 124 provided on the second semiconductor substrate 21 and extending in a column direction. The readout circuit 122 outputs a pixel signal based on an electric charge output from the sensor pixel 112. One readout circuit 122 is provided for each of the four sensor pixels 112.

The third substrate unit 130 includes a semiconductor substrate 131 and a logic circuit 132 provided on the semiconductor substrate 131. The logic circuit 132 has a function of processing a pixel signal, and includes, for example, a vertical drive circuit 133, a column signal processing circuit 134, a horizontal drive circuit 135, and a system control circuit 136.

For example, the vertical drive circuit 133 sequentially selects the plurality of sensor pixels 112 row by row. The column signal processing circuit 134 performs, for example, correlated double sampling (CDS) processing on the pixel signal output from each sensor pixel 112 in the row selected by the vertical drive circuit 133. The column signal processing circuit 134 extracts a signal level of a pixel signal by performing CDS processing, for example, and holds pixel data corresponding to the amount of light received by each sensor pixel 112. For example, the horizontal drive circuit 135 sequentially outputs the pixel data held in the column signal processing circuit 134 to the outside. The system control circuit 136 controls driving of each block (vertical drive circuit 133, column signal processing circuit 134, and horizontal drive circuit 135) in the logic circuit 132, for example.

Figure 2:
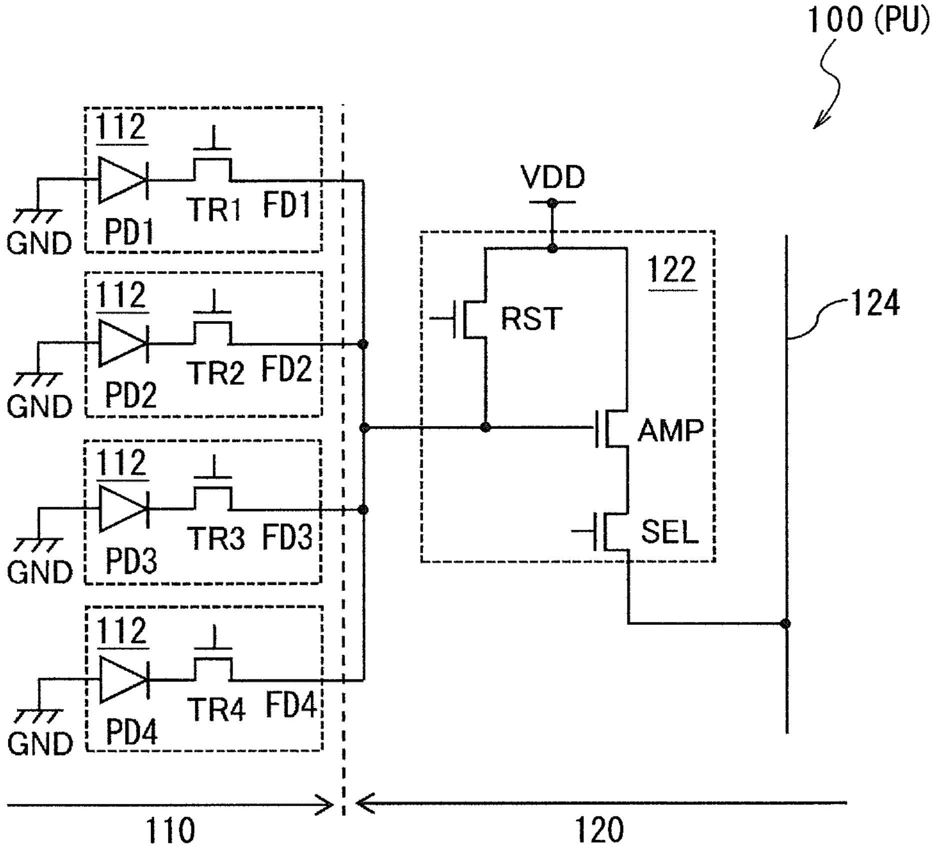
FIG. 2 is a circuit diagram illustrating a configuration example of a pixel unit according to the first embodiment of the present disclosure.

FIG. 2 is a circuit diagram illustrating a configuration example of a pixel unit PU according to the first embodiment of the present disclosure. As illustrated in FIG. 2, in the imaging device 100, four sensor pixels 112 are electrically connected to one readout circuit 122 to constitute one pixel unit PU. The four sensor pixels 112 share one readout circuit 122, and each output of the four sensor pixels 112 is input to the shared readout circuit 122.

Each sensor pixel 112 has a common component. In FIG. 2, in order to distinguish the components of each sensor pixel 112 from each other, identification numbers (1, 2, 3, and 4) are added to the end of the reference signs (for example, PD, TG, and FD described later) of the components of each sensor pixel 112. Hereinafter, in a case where it is not necessary to distinguish the components of each sensor pixel 112 from each other, the identification numbers at the ends of the reference numerals of the components of each sensor pixel 112 are omitted.

Each sensor pixel 112 includes, for example, a photodiode PD, a transfer transistor TR electrically connected to the photodiode PD, and a floating diffusion FD that temporarily holds an electric charge output from the photodiode PD via the transfer transistor TR. The photodiode PD generates electric charges corresponding to an amount of received light by photoelectric conversion. A cathode of the photodiode PD is electrically connected to a source of the transfer transistor TR, and an anode of the photodiode PD is electrically connected to a reference potential line (for example, ground). A drain of the transfer transistor TR is electrically connected to the floating diffusion FD, and a gate electrode of the transfer transistor TR is electrically connected to the pixel drive line 123. The transfer transistor TR is, for example, a complementary metal oxide semiconductor (CMOS) transistor.

The floating diffusions FD of the sensor pixels 112 sharing one readout circuit 122 are electrically connected to each other and are electrically connected to an input end of the common readout circuit 122. The readout circuit 122 includes, for example, an amplification transistor AMP, a reset transistor RST, and a selection transistor SEL. Note that the selection transistor SEL may be omitted as necessary.

A source of the reset transistor RST (the input end of the readout circuit 122) is electrically connected to the floating diffusion FD, and a drain of the reset transistor RST is electrically connected to a power supply line VDD and a drain of the amplification transistor AMP. A gate electrode of the reset transistor RST is electrically connected to the pixel drive line 123 (see FIG. 1). A source of the amplification transistor AMP is electrically connected to a drain of the selection transistor SEL, and a gate electrode of the amplification transistor AMP is electrically connected to the source of the reset transistor RST. A source of the selection transistor SEL (an output end of the readout circuit 122) is electrically connected to the vertical signal line 124, and a gate electrode of the selection transistor SEL is electrically connected to the pixel drive line 123 (see FIG. 1).

The transfer transistor TR transfers electric charges of the photodiode PD to the floating diffusion FD when turned on. The reset transistor RST resets the potential of the floating diffusions FD to a predetermined potential. When the reset transistor RST is turned on, the potential of the floating diffusion FD is reset to the potential of the power supply line VDD. The selection transistor SEL controls the output timing of the pixel signal from the readout circuit 122.

The amplification transistor AMP generates a signal of a voltage corresponding to the level of the electric charges held in the floating diffusion FD as a pixel signal. The amplification transistor AMP constitutes a source follower type amplifier, and outputs a pixel signal having a voltage corresponding to the level of the electric charges generated in the photodiode PD. When the selection transistor SEL is turned on, the amplification transistor AMP amplifies the potential of the floating diffusion FD, and outputs a voltage corresponding to the potential to the column signal processing circuit 134 via the vertical signal line 124.

Note that, as will be described later, in the first and second embodiments of the present disclosure, the shape (hereinafter, planar shape) of the sensor pixel 112 in plan view is a rhombus. In a third embodiment, the planar shape of the sensor pixel 112 is a square. Furthermore, FIG. 1 illustrates a case where the imaging device 100 includes the first substrate unit 110, the second substrate unit 120, and the third substrate unit 130, but this is merely an example. The first embodiment of the present disclosure and the second and third embodiments to be described later are not limited to the stacked configuration illustrated in FIG. 1. For example, the second substrate unit 120 and the third substrate unit 130 may be configured by one board unit. In this case, elements and circuits such as transistors included in each of the second substrate unit 120 and the third substrate unit 130 may be provided on one semiconductor substrate.

(Configuration Example of Pixel)

Figure 3:
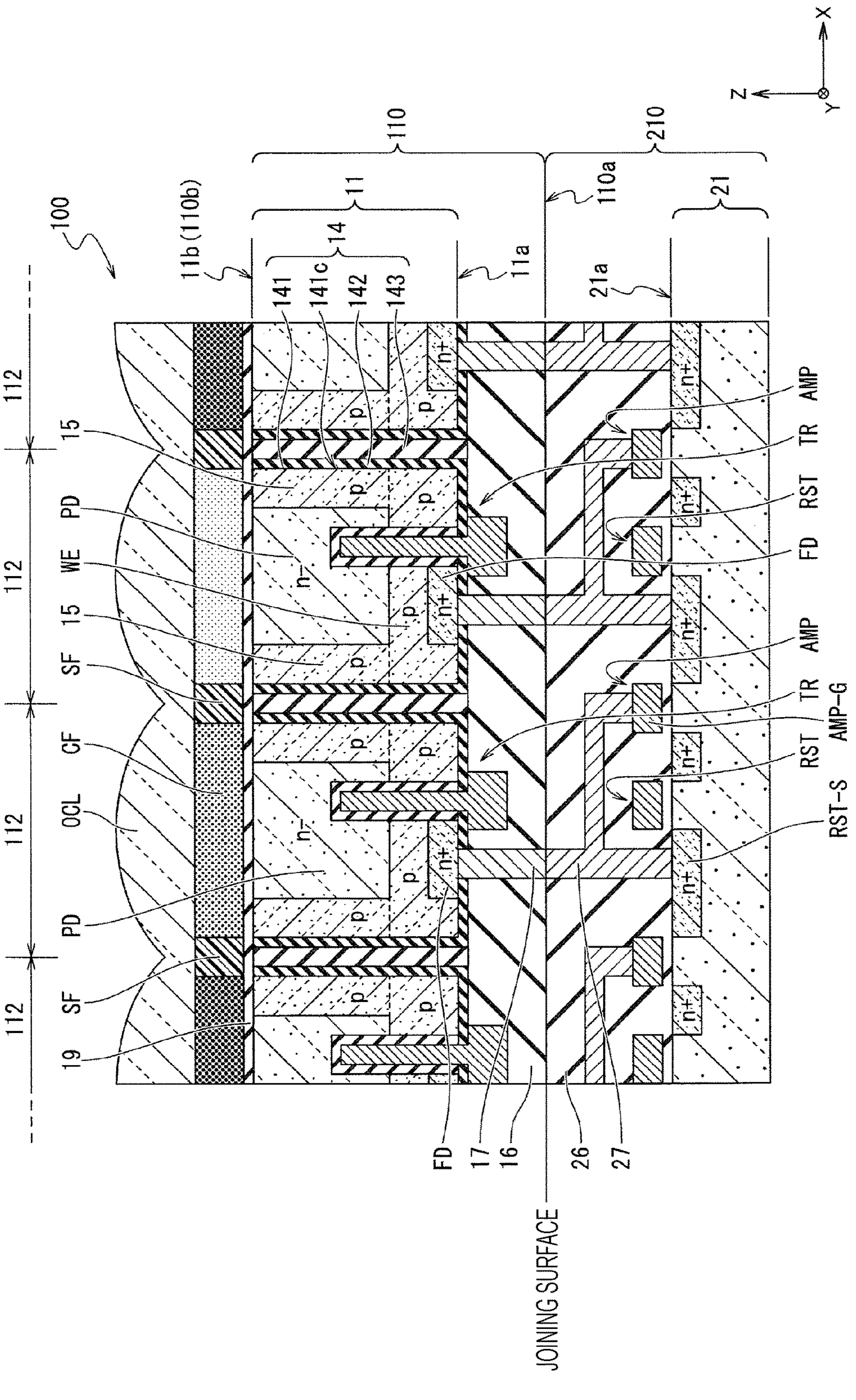
FIG. 3 is a cross-sectional view illustrating a configuration example of sensor pixels of the imaging device according to the first embodiment of the present disclosure.

Next, a configuration example of the sensor pixel 112 of the imaging device 100 according to the first embodiment of the present disclosure will be described. FIG. 3 is a cross-sectional view illustrating a configuration example of the sensor pixel 112 of the imaging device 100 according to the first embodiment of the present disclosure. As illustrated in FIG. 3, the imaging device 100 is a back-illuminated imaging device. A back surface 110*b* of the first substrate unit 110 is a light incident surface, and a fixed charge film 19, a color filter CF, a light shielding film SF, and an on-chip lens OCL are provided on the back surface 110*b* side. The color filter CF and the on-chip lens OCL are provided for each sensor pixel 12.

The fixed charge film 19 is provided on the back surface 110*b* of the first substrate unit 110, and is interposed between the back surface 110*b* and the color filter CF and between the back surface 110*b* and the light shielding film SF. The light shielding film SF is arranged between the color filter CF of one sensor pixel and the color filter CF of the other sensor pixel adjacent to each other. Furthermore, the second substrate unit 120 is bonded to the front surface 110*a* side of the first substrate unit 110.

The first semiconductor substrate 11 included in the first substrate unit 110 includes, for example, a silicon (Si) substrate. The photodiode PD, the transfer transistor TR, and the floating diffusion FD are provided on the first semiconductor substrate 11. For example, the photodiode PD is an n−-type, and the floating diffusion FD is an n+-type. Furthermore, a p-type well region WE is provided between the photodiode PD and the floating diffusion FD. A channel of the transfer transistor TR is formed in the p-type well region WE. The photodiode PD, the transfer transistor TR, and the floating diffusion FD are provided for each sensor pixel 12.

In the first semiconductor substrate 11, an inter-pixel isolation portion 14 that electrically separates adjacent sensor pixels 12 from each other is provided. For example, the inter-pixel isolation portion 14 includes a trench 141 provided in the first semiconductor substrate 11, a fixed charge film 142 provided on a side surface of the trench 141, and a buried film 143 buried in the trench 141 via the fixed charge film 142. Here, it is assumed that a groove (trench) for the semiconductor substrate is provided even in a case where a material different from the semiconductor substrate is filled inside the trench.

The type of the buried film 143 is not particularly limited, and is, for example, p-type amorphous Si, P-type silicon carbide (SiC), or metal. In a case where the first semiconductor substrate 11 is a Si substrate, if amorphous Si having a thermal expansion coefficient close to that of the Si substrate is used as the buried film 143, subsequent defect generation can also be suppressed. Furthermore, in a case where p-type SiC is used as the buried film 143, the hole accumulation effect is enhanced due to the wide band gap. In a case where metal is used as the buried film 143, it is possible to prevent light incident on one sensor pixel 112 from entering the other adjacent sensor pixel 112 on one side. Furthermore, in a case where a conductive embedded material such as metal is used as the buried film 143, for example, a negative voltage may be applied to the conductive embedded material.

The fixed charge film 142 is a film that generates a fixed electric charge. The fixed charge film 142 generates holes on the side surface of the trench 141 and combines the generated holes with electrons generated due to damage, thereby reducing dark current of the sensor pixel 112. The fixed charge film 142 may include, for example, an oxide or nitride containing at least one of hafnium, aluminum, zirconium, thallium, or titanium. Furthermore, it may also include the oxide or nitride containing at least one of lanthanum, cerium, neodymium, promethium, samarium, europium, gadolinium, terbium, dysprosium, holmium, thulium, ytterbium, lutetium, or yttrium. Further, the fixed charge film may include hafnium oxynitride or aluminum oxynitride. Furthermore, silicon or nitrogen can be added to the fixed charge film 142 in an amount that does not impair the insulating properties. Thus, heat resistance and the like may be improved. It is desirable that the fixed charge film 142 has a film thickness controlled in consideration of a wavelength and a refractive index, and has a role as an antireflection film for a semiconductor substrate having a high refractive index.

Furthermore, in the first semiconductor substrate 11, a p-type region 15 is provided between the inter-pixel isolation portion 14 and the photodiode PD.

A first interlayer insulating film 16 is provided on the front surface 11*a* side of the first semiconductor substrate 11. The first interlayer insulating film 16 is, for example, a silicon oxide film ($SiO_2$ film), a silicon nitride film (SiN film), a silicon oxynitride film (SiON film) or a silicon carbonitride film (SiCN film), or a stacked film including one or more of these films.

A plurality of wirings connected to the first semiconductor substrate 11 is provided on the front surface 11*a* side of the first semiconductor substrate 11. For example, a first wiring 17 connected to the floating diffusion FD is provided on the front surface 11*a* side of the first semiconductor substrate 11. A material constituting the first wiring 17 is not particularly limited, and includes copper (Cu) or a Cu alloy containing Cu as a main component, aluminum (Al) or an Al alloy containing Al as a main component, tungsten (W), or the like, as an example.

The second semiconductor substrate 21 included in the second substrate unit 120 includes, for example, a silicon substrate. The amplification transistor AMP, the reset transistor RST, and the selection transistor SEL are provided on a front surface 21*a* side of the second semiconductor substrate 21. A second interlayer insulating film 26 is provided on the front surface 11*a* side of the second semiconductor substrate 21. The second interlayer insulating film 26 is, for example, a silicon oxide film ($SiO_2$ film), a silicon nitride film (SiN film), a silicon oxynitride film (SiON film) or a silicon carbonitride film (SiCN film), or a stacked film including one or more of these films.

A plurality of wirings connected to the second semiconductor substrate 21 is provided on the front surface 21*a* side of the second semiconductor substrate 21. For example, a second wiring 27 connected to a gate electrode AMP-G of the amplification transistor AMP and a source RST-S of the reset transistor RST is provided on the front surface 21*a* side of the second semiconductor substrate 21. A material constituting the second wiring 27 is not particularly limited, and includes Cu or a Cu alloy containing Cu as a main component, Al or an Al alloy containing Al as a main component, W, or the like, as an example.

In the imaging device 100, the first interlayer insulating film 16 and the second interlayer insulating film 26 are bonded to each other. Furthermore, on a bonding plane between the first interlayer insulating film 16 and the second interlayer insulating film 26, for example, the first wiring 17 and the second wiring 27 are Cu—Cu joined. Thus, in each of the plurality of sensor pixels 112, the floating diffusion FD is connected to the gate electrode AMP-G of the amplification transistor AMP and the source RST-S of the reset transistor RST via the first wiring 17 and the second wiring 27.

Meanwhile, in the imaging device 100, a (110) substrate in which the crystal plane of the front surface 11*a* is the (110) plane is used as the first semiconductor substrate 11. Furthermore, in the inter-pixel isolation portion 14 provided in the first semiconductor substrate 11, at least a part of a side surface 141*c* of the trench 141 has a (111) plane as a crystal plane. For example, all the side surfaces 141*c* of the trench 141 are (111) planes. In order to achieve this, the sensor pixel 112 has a rhombic planar shape from the Z-axis direction.

Figure 4A:
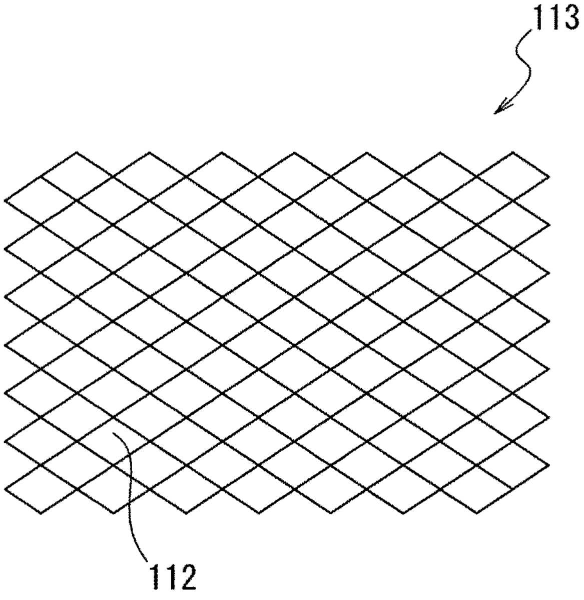
FIG. 4A is a plan view illustrating a configuration example of a pixel region according to the first embodiment of the present disclosure.
Figure 4B:
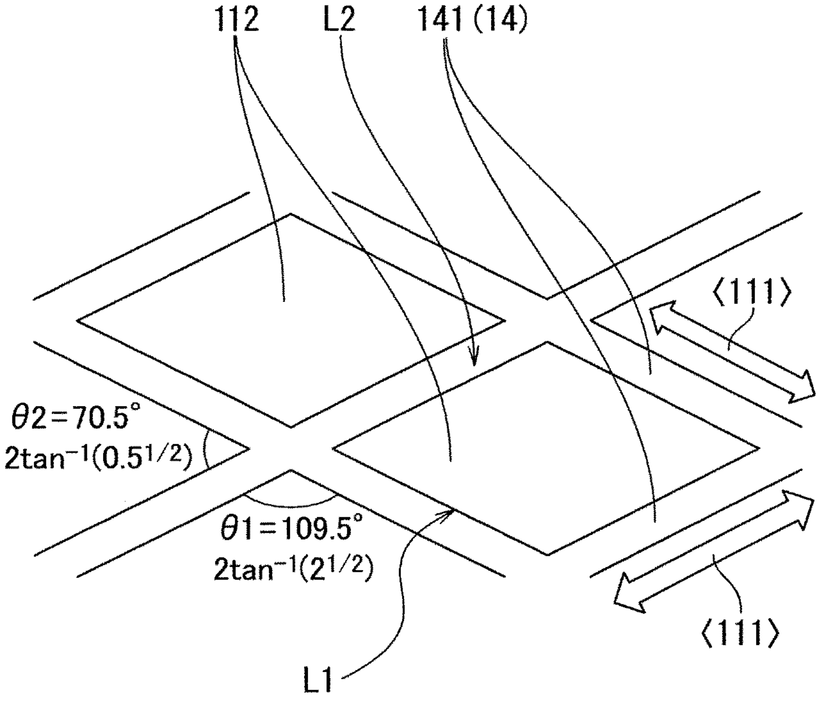
FIG. 4B is an enlarged view of a part of FIGS. 4A and 4B.

FIG. 4A is a plan view illustrating a configuration example of the pixel region 113 according to the first embodiment of the present disclosure. FIG. 4B is an enlarged view of a part of FIGS. 4A and 4B. FIGS. 4A and 4B illustrate planar shapes of the plurality of sensor pixels 112 when the first semiconductor substrate 11 is viewed from the front surface 11*a* side (see FIG. 3). As illustrated in FIGS. 4A and 4B, the planar shape of the sensor pixel 112 is a rhombus. As for internal angles of the rhombus, for example, an angle θ1 of an obtuse angle portion (an example of the "angle of a first internal angle" of the present disclosure) is 109.5°, and an angle θ2 of an acute angle portion (an example of the "angle of a second internal angle" of the present disclosure) is 70.5°.

Furthermore, a first side L1 constituting an outer periphery of the rhombus and a second side L2 constituting the outer periphery and intersecting the first side are each parallel to a longitudinal direction of a crystal orientation <111>. That is, the trench 141 of the inter-pixel isolation portion 14 arranged around the sensor pixel 12 extends in a crystal orientation <111> direction on the front surface 11*a* of the first semiconductor substrate 11. Thus, the side surfaces 141*c* (see FIG. 3) of the trench 141 of the inter-pixel isolation portions 14 are all (111) planes.

(Manufacturing Method)

Next, a manufacturing method for the imaging device 100 illustrated in FIGS. 3, 4A, and 4B will be described. Note that the imaging device is manufactured using various devices such as a film forming device (a chemical vapor deposition (CVD) apparatus, a thermal oxidation furnace, a sputtering apparatus, a spin coater, a resist coating apparatus, and the like), an exposure apparatus, an ion implantation apparatus, an annealing apparatus, an etching apparatus, and a chemical mechanical polishing (CMP) apparatus. Hereinafter, these apparatuses are collectively referred to as manufacturing apparatuses.

Figure 5:
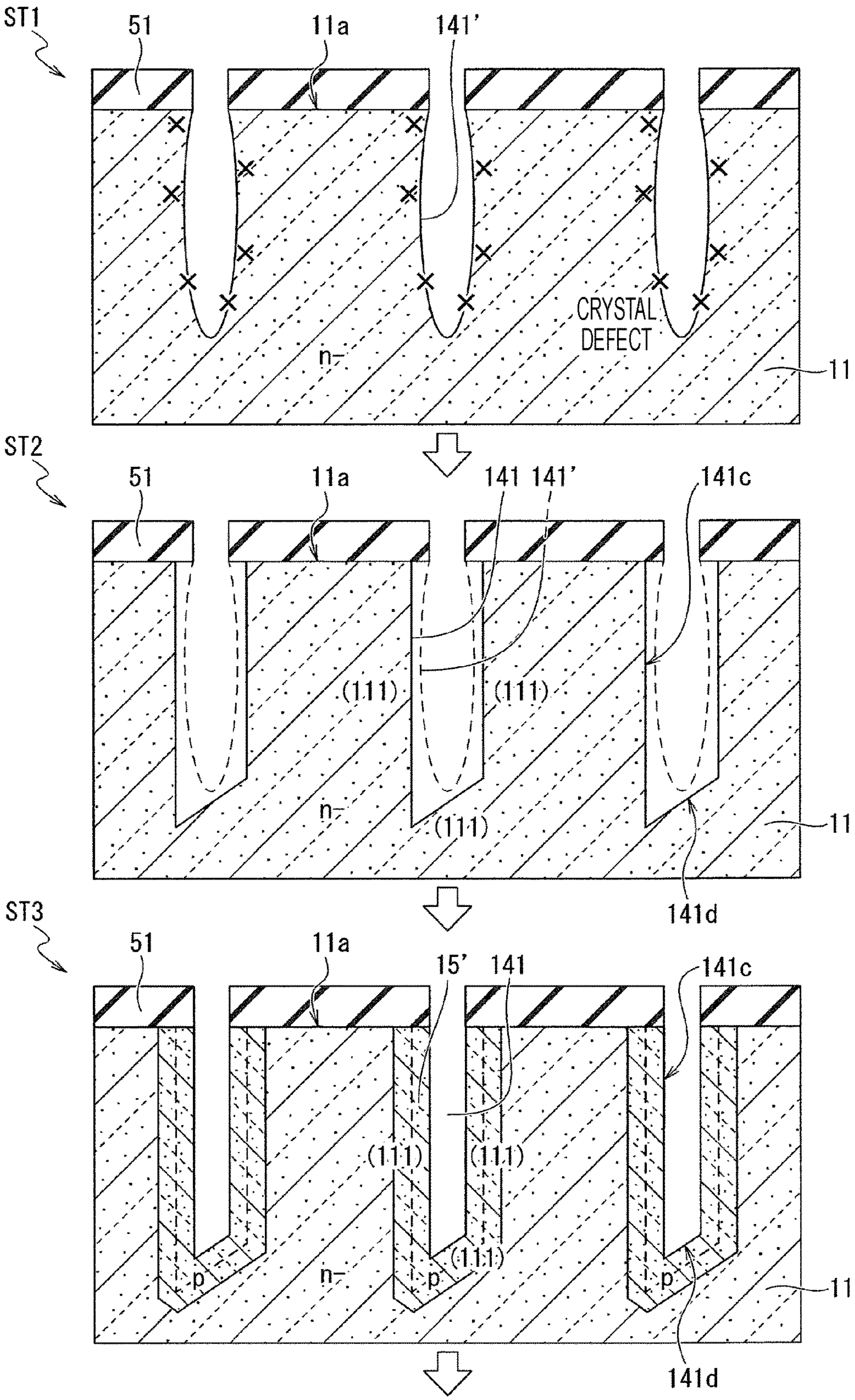
FIG. 5 is a cross-sectional view illustrating a manufacturing method for the imaging device according to the first embodiment of the present disclosure in order of processes.
Figure 6:
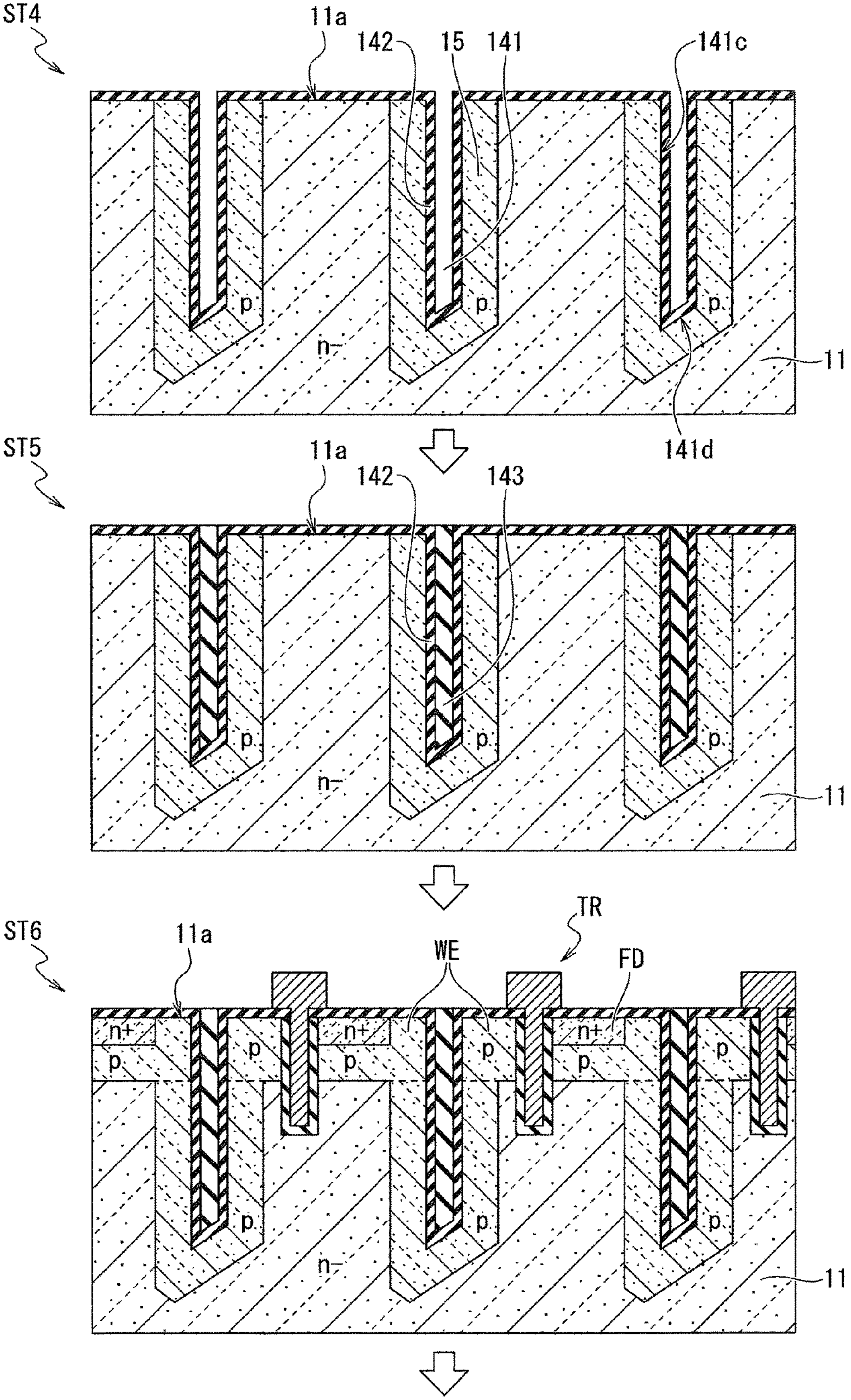
FIG. 6 is a cross-sectional view illustrating the manufacturing method for the imaging device according to the first embodiment of the present disclosure in order of processes.
Figure 7:
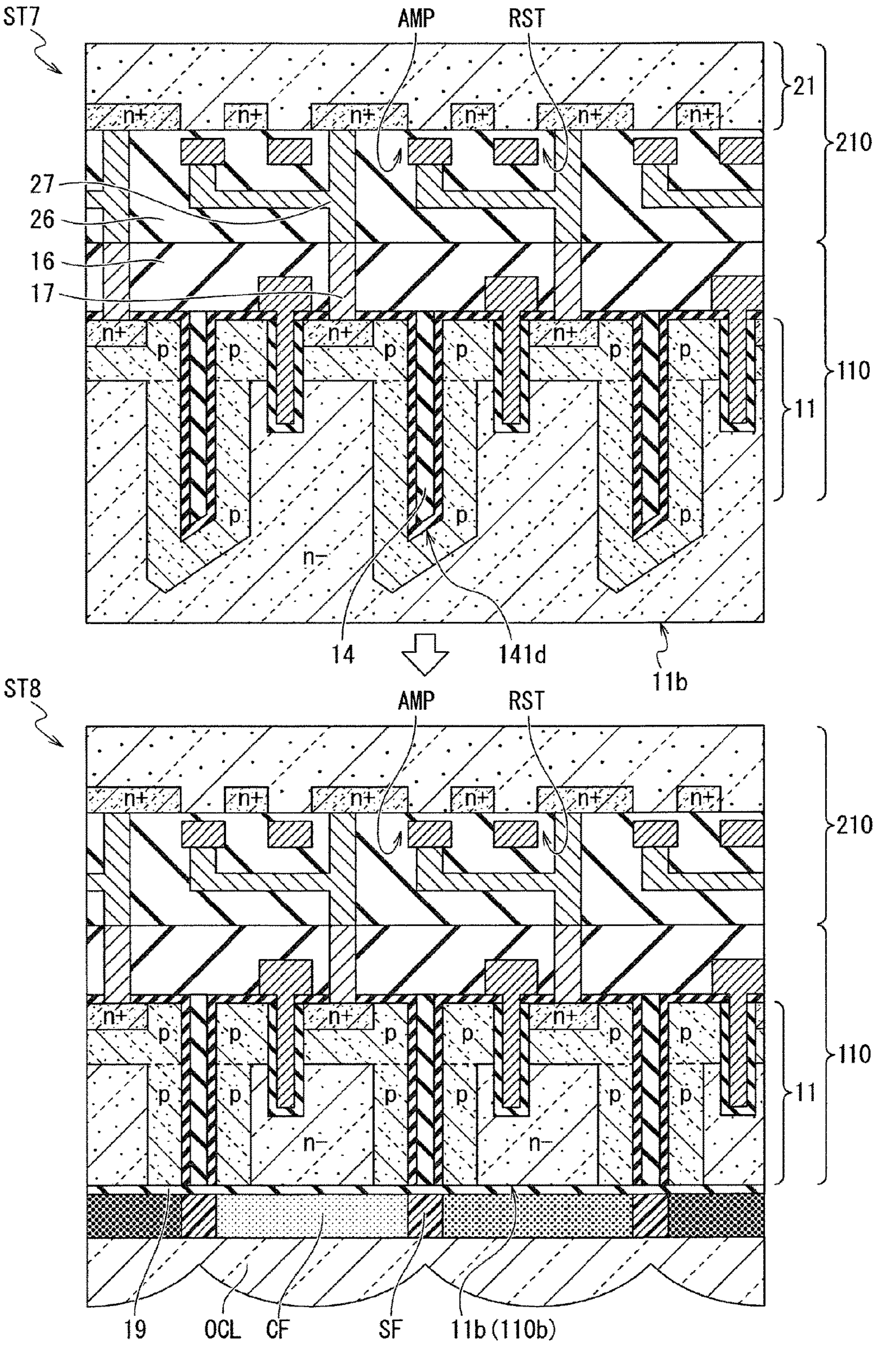
FIG. 7 is a cross-sectional view illustrating the manufacturing method for the imaging device according to the first embodiment of the present disclosure in order of processes.

FIGS. 5 to 7 are cross-sectional views illustrating the manufacturing method for the imaging device 100 according to the first embodiment of the present disclosure in order of processes. In the first embodiment, the (110) Si wafer in which the crystal plane of the front surface 11*a* is the (110) plane is used as the first semiconductor substrate 11. In step ST1 of FIG. 5, the manufacturing apparatus dry-etches the front surface 11*a* of the first semiconductor substrate 11 along the crystal orientation <111> direction (that is, along the (111) plane) so that the planar shape of the sensor pixel 12 is a rhombus shape (see FIGS. 4A and 4B).

For example, the manufacturing apparatus forms an insulating film 51 of $SiO_2$ or the like on the front surface 11*a* of the first semiconductor substrate 11 by a CVD method. Next, the manufacturing apparatus forms a resist pattern (not illustrated) on the insulating film 51 using a photolithography technique. Then, the manufacturing apparatus patterns the insulating film 51 using the resist pattern as a mask. After patterning the insulating film 51, the manufacturing apparatus removes the resist pattern.

Next, the manufacturing apparatus dry-etches the first semiconductor substrate 11 using the patterned insulating film 51 as a hard mask. The dry etching is, for example, reactive ion etching (RIE). Thus, a trench 141' is formed along the crystal orientation <111> direction on the front surface 11*a* side of the first semiconductor substrate 11. Since the trench 141' is formed by dry etching, crystal defects (etching damage) due to processing occur on side surfaces of the trench 141'.

Figure 8:
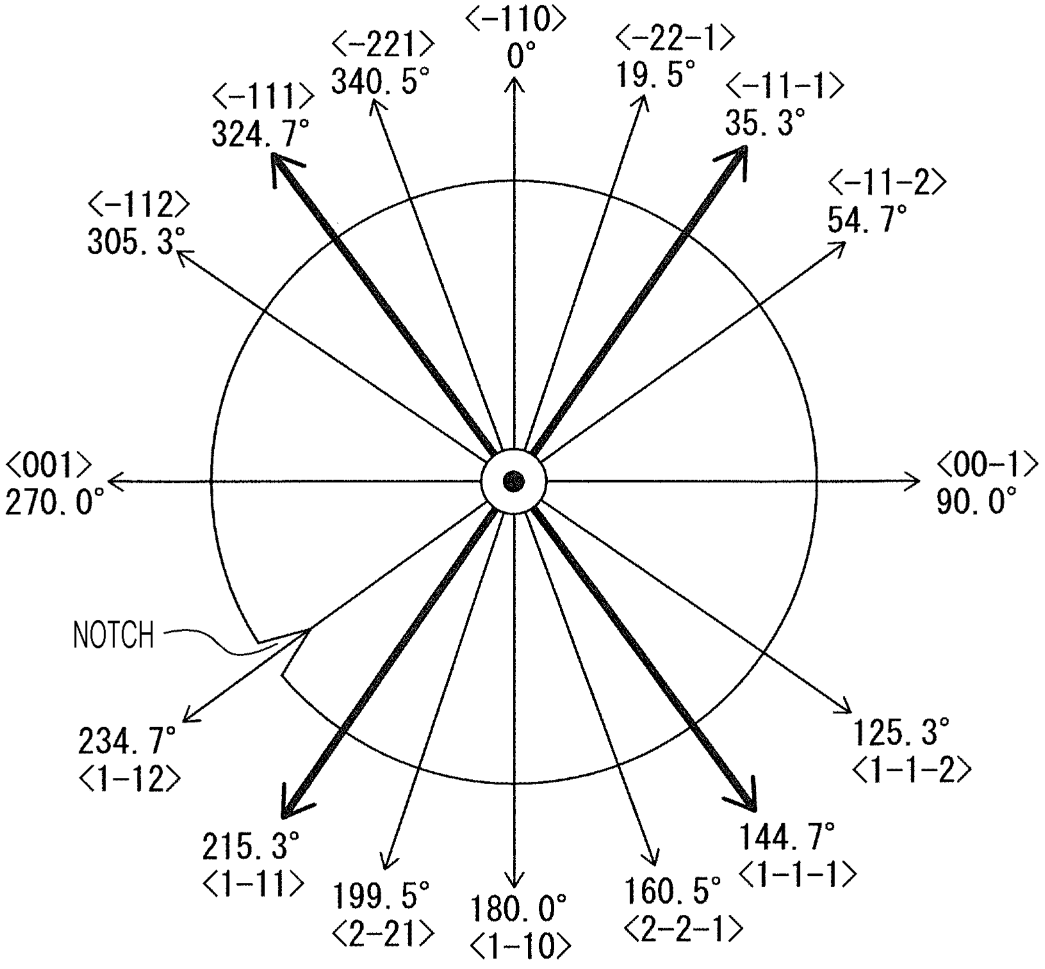
FIG. 8 is a plan view illustrating a relationship between a crystal orientation and a notch in a (110) Si wafer, and is a view particularly illustrating a crystal orientation <111> direction emphasized with a thick line.

Note that, in step ST1, the crystal orientation <111> direction can be specified using a notch previously provided in the (110) Si wafer. FIG. 8 is a plan view illustrating a relationship between a crystal orientation and a notch in the (110) Si wafer, and is a view illustrating a crystal orientation <111> direction emphasized with a thick line. As illustrated in FIG. 5, in the (110) Si wafer, the direction of the straight line connecting the notch and the wafer center is, for example, a <1−12> crystal orientation.

Therefore, for example, by rotating the wafer clockwise by 19.4° about the wafer center as an axis from a state in which the direction of the straight line connecting the notch and the wafer center coincides with the X-axis direction, a crystal orientation <1−11> direction can coincide with the X-axis direction. The crystal orientation <1−11> direction is a direction equivalent to the <111> direction. In this state, when exposure processing of photolithography is performed, the direction of the pattern side of the resist pattern is set to the X-axis direction and the direction intersecting the X-axis direction by 70.5° (or 109.5°) in plan view, that is, the <111> direction. Then, by patterning the insulating film 51 using this resist pattern and etching the (110) Si wafer using the patterned insulating film 51 as a hard mask, the trench 141' extending in the <111> direction can be formed.

Next, in step ST2 of FIG. 5, the manufacturing apparatus wet-etches the first semiconductor substrate 11 with an alkaline chemical solution. In wet etching using an alkaline chemical solution, the etching rate largely depends on the crystal orientation, and etching does not proceed in the <111> direction (that is, a direction perpendicular to the (111) plane), so that the trench 141 having a vertical and flat cross-sectional shape along the (111) plane is obtained regardless of the shape after RIE. Each of the side surfaces 141*c* and bottom surface 141*d* of the trench 141 is the (111) plane. This etching is substantially stopped when the flat (111) plane is formed, and thus has good stability. In addition, an effect of removing crystal defects generated by RIE is also obtained.

Next, in step ST3 of FIG. 5, the manufacturing apparatus forms a Si epitaxy layer 15' containing a high concentration of an acceptor (that is, the p-type impurity) in the trench 141 by an epitaxial growth method. Since the epitaxial growth method is a mode of growth in which Si is arranged in alignment with the crystal plane of the underlying layer, the surface of the Si epitaxy layer 15' becomes the (111) plane. That is, each of the side surfaces 141*c* and the bottom surface 141*d* of the trench 141 after formation of the Si epitaxy layer 15' is the (111) plane.

In a case where the trench processing is performed from the front surface 11*a* side of the first semiconductor substrate 11, high temperature treatment can be performed because the metal wirings do not exist. By forming the Si epitaxy layer 15', the trench 141 widened by the wet etching in step ST2 can be adjusted to a desired width.

Since electrons generated from the interface state with the film covering the insides of the trench 141 are captured by high-concentration holes, it is possible to reduce the dark current by forming the Si epitaxy layer 15' containing a high concentration of an acceptor. The acceptor may have a desired distribution by adjusting the temperature at the time of forming the Si epitaxy layer 15'. Additional heat treatment may be performed after formation of the Si epitaxy layer 15' to expand the distribution of acceptors from the Si epitaxy layer 15' toward the first semiconductor substrate 11 side. The Si epitaxy layer 15' and the region where the acceptor is thermally diffused from the Si epitaxy layer 15' and becomes p-type correspond to the p-type region 15 illustrated in FIG. 3.

Next, in step ST4 of FIG. 6, the manufacturing apparatus forms the fixed charge film 142 on the entire front surface 11*a* of the first semiconductor substrate 11 including the side surfaces 141*c* and the bottom surface 141*d* of the trench 141.

Next, in step ST5 of FIG. 6, the manufacturing apparatus forms the buried film 143 in the trench 141. For example, the manufacturing apparatus forms the buried film 143 on the front surface 11*a* of the first semiconductor substrate 11, and performs CMP processing on the front surface of the buried film 143 to leave the buried film 143 only in the trench 141.

Next, in step ST6 of FIG. 6, the manufacturing apparatus forms the well regions WE in the first semiconductor substrate 11. Next, the manufacturing apparatus forms the transfer transistors TR on the first semiconductor substrate 11. Furthermore, the manufacturing apparatus forms the floating diffusion FD on the first semiconductor substrate 11 before and after the formation of the transfer transistor TR.

Next, in step ST7 of FIG. 7, the manufacturing apparatus forms a plurality of wirings including the first wirings 17 on the front surface 11*a* side of the first semiconductor substrate 11 and the first interlayer insulating film 16 covering the plurality of first wirings 17 to complete the first substrate unit 110.

Next, the manufacturing apparatus bonds the first substrate unit 110 and a second substrate unit 210 formed separately from the first substrate unit 110 to each other. In this step, the first interlayer insulating film 16 of the first substrate unit 110 and the second interlayer insulating film 26 of the second substrate unit 210 are bonded, and the first wirings 17 of the first substrate unit 110 and the second wirings 27 of the second substrate unit 210 are Cu—Cu bonded.

Next, the manufacturing apparatus performs CMP processing on a back surface 11*b* of the first semiconductor substrate 11 to thin the first semiconductor substrate 11. Thus, the inter-pixel isolation portion 14 is scraped from the bottom surface side of the trench and exposed to the back surface 11*b*, and becomes the inter-pixel isolation portion penetrating the first semiconductor substrate 11.

Next, as illustrated in step ST8 of FIG. 7, the manufacturing apparatus forms the fixed charge film 19 on the back surface 110*b* of the first substrate unit 110 (which is also the back surface 11*b* of the first semiconductor substrate 11 described later). The fixed charge film 19 is a film that generates a fixed electric charge. The fixed charge film 19 generates holes on the back surface 11*b* of the first semiconductor substrate 11, and combines the generated holes with electrons generated due to damage by CMP or the like, thereby reducing the dark current of the sensor pixel 112.

Next, the manufacturing apparatus forms the light shielding film SF and the color filter CF on the back surface 11*b* side of the first semiconductor substrate 11 via the fixed charge film 19. Then, the manufacturing apparatus attaches the on-chip lens OCL to the color filter CF. Through the above steps, the imaging device 100 illustrated in FIGS. 3, 4A, and 4B are completed.

Effect of First Embodiment

As described above, the imaging device 100 according to the first embodiment of the present disclosure includes the first semiconductor substrate 11, the plurality of sensor pixels 112 that is provided on the first semiconductor substrate 11 and performs photoelectric conversion, and the trench 141 provided in the depth direction (for example, in the Z-axis direction) of the first semiconductor substrate 11 from the front surface 11*a* of the first semiconductor substrate 11. The first semiconductor substrate 11 is a (110) substrate in which the front surface 11*a* is the (110) plane. At least a part of the side surfaces 141*c* (for example, the entire side surfaces 141*c*) of the trench 141 is a (111) plane.

With this configuration, it is possible to form the trench 141 in which at least a part of the side surfaces 141*c* is the (111) plane by performing crystal anisotropic etching in which the (110) plane is easily etched and the (111) plane is hardly etched on the front surface 11*a* of the first semiconductor substrate 11. The crystal anisotropic etching described above can be performed by wet etching using an alkaline solution.

In the wet etching using an alkaline solution, the etching chemically proceeds, and thus it is possible to suppress occurrence of crystal defects on the side surfaces 141*c* of the trench 141 as compared with the dry etching. In addition, the wet etching using an alkaline solution can also remove crystal defects by etching a semiconductor containing crystal defects. Thus, the imaging device 100 can reduce dark current and white spots caused by crystal defects.

For example, the imaging device 100 is provided on the first semiconductor substrate 11, and includes the inter-pixel isolation portion 14 that separates one sensor pixel 112 and another sensor pixel 112 adjacent to each other among the plurality of sensor pixels 112. The inter-pixel isolation portion 14 includes the trench 141.

With this configuration, since the side surfaces 141*c* of the trench 141 of the inter-pixel isolation portion 14 have a perpendicular and flat shape with respect to the front surface 11*a* of the first semiconductor substrate 11, the sensor pixel 112 can be miniaturized.

Furthermore, since the side surfaces 141*c* of the trench 141 of the inter-pixel isolation portion 14 have a vertical and flat shape, the buried film 143 is easily embedded in the trench 141. Thus, the pixel separation performance is further stabilized with high performance, and the reliability is improved.

In addition, the second semiconductor substrate 21 bonded to the first semiconductor substrate 11 may be a (100) substrate in which a facing surface (for example, the front surface 21*a*) facing the first semiconductor substrate 11 is a (100) plane. For example, the second semiconductor substrate 21 may be a (100) plane Si wafer. With this configuration, it is possible to maintain high performance of the transistor (for example, the amplification transistor AMP, the reset transistor RST, and the like) provided on the front surface 21*a* side of the second semiconductor substrate 21.

The manufacturing method for the imaging device 100 according to the first embodiment of the present disclosure includes a step of forming the trench 141 in the Z-axis direction from the front surface 11*a* of the first semiconductor substrate 11 in which the plurality of sensor pixels 112 that performs photoelectric conversion is provided. The first semiconductor substrate 11 is the (110) substrate in which the front surface 11*a* is the (110) plane. In the step of forming the trench 141, the first semiconductor substrate 11 is etched along the (111) plane. In this manner, it is possible to manufacture the imaging device 100 capable of reducing dark current and white spots caused by crystal defects.

Modification

In the first embodiment described above, the trench 141 of the inter-pixel isolation portion 14 is formed from the front surface 11*a* side of the first semiconductor substrate 11. However, in the first embodiment of the present disclosure, the trench 141 may be formed not from the front surface 11*a* side of the first semiconductor substrate 11 but from the back surface 11*b* side.

Figure 9:
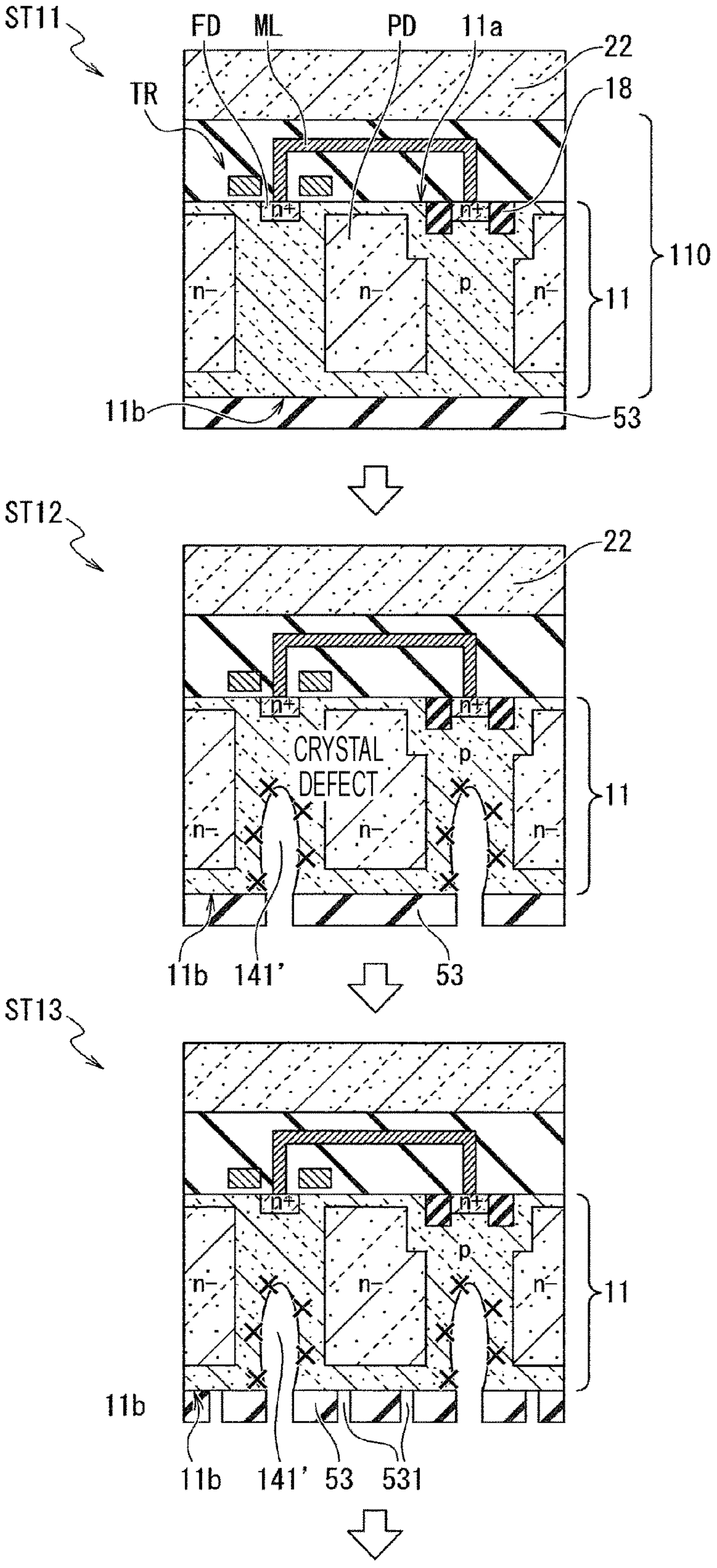
FIG. 9 is a cross-sectional view illustrating the manufacturing method for the imaging device according to a modification of the first embodiment of the present disclosure in order of processes.
Figure 10:
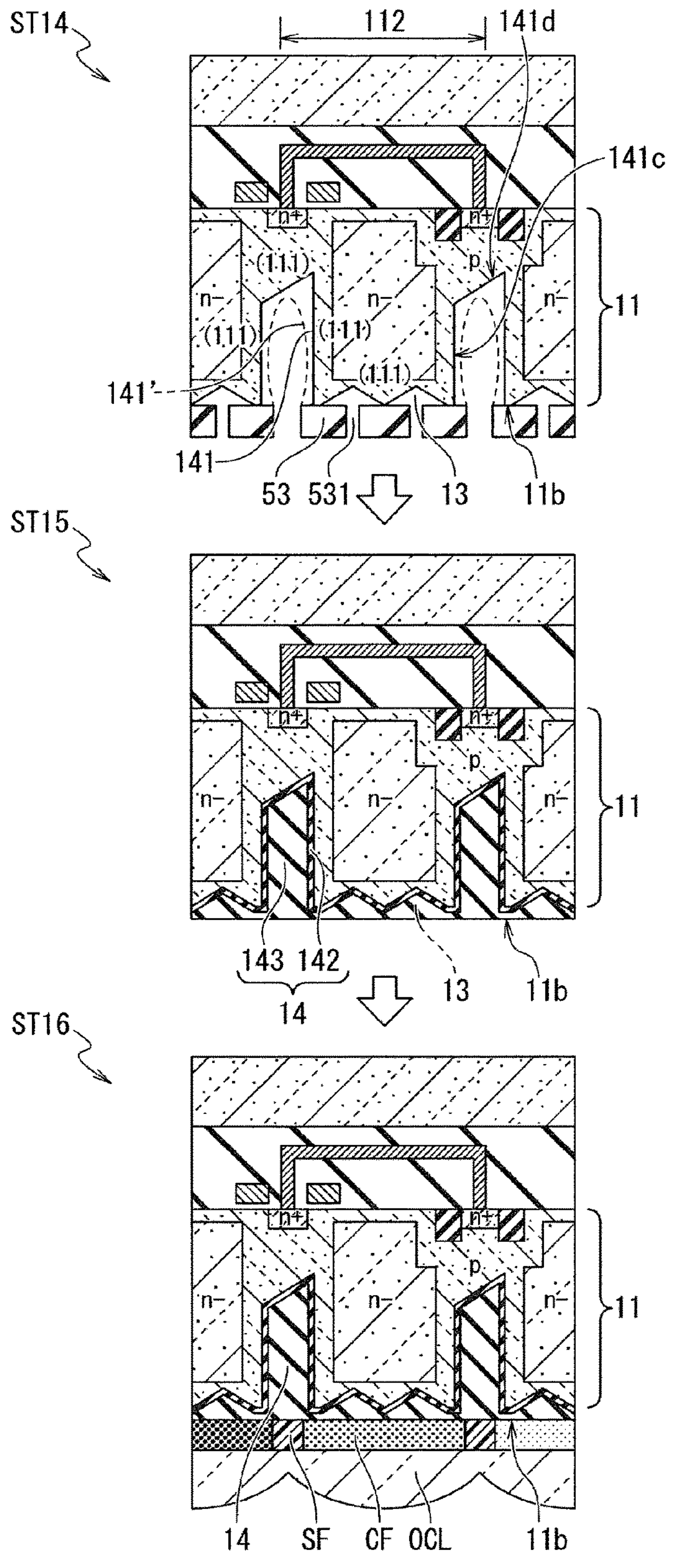
FIG. 10 is a cross-sectional view illustrating the manufacturing method for the imaging device according to a modification of the first embodiment of the present disclosure in order of processes.

FIGS. 9 and 10 are cross-sectional views illustrating a manufacturing method for the imaging device 100 according to a modification of the first embodiment of the present disclosure in order of processes. Also in this modification, the (110) Si wafer is used as the first semiconductor substrate 11. In the (110) Si wafer, not only the front surface 11*a* but also the crystal plane of the back surface 11*b* is the (110) plane.

As illustrated in step ST11 of FIG. 9, the manufacturing apparatus forms the photodiode PD, the transfer transistor TR, the floating diffusion FD, an element isolation layer 18, a metal wiring ML, and the first interlayer insulating film 16 on the front surface 11*a* side of the first semiconductor substrate 11. Next, the manufacturing apparatus attaches a support substrate 22 to the front surface 11*a* side of the first semiconductor substrate 11 via the first interlayer insulating film 16. The support substrate 22 is, for example, a (100) Si wafer. Note that a part of the pixel transistor (for example, the amplification transistor AMP, the reset transistor RST, the selection transistor SEL, and the like illustrated in FIG. 2) may be disposed on the support substrate 22.

Next, the manufacturing apparatus performs CMP processing on the back surface 11*b* of the first semiconductor substrate 11 to thin the first semiconductor substrate 11. Then, the manufacturing apparatus forms the insulating film 53 of $SiO_2$ or the like on the back surface 11*b* of the first semiconductor substrate 11.

Next, in step ST12 of FIG. 9, the manufacturing apparatus dry-etches the back surface 11*b* of the first semiconductor substrate 11 along the crystal orientation <111> direction (that is, along the (111) plane) so that the planar shape of the sensor pixel 12 is a rhombus shape (see FIGS. 4A and 4B).

For example, the manufacturing apparatus forms a resist pattern (not illustrated) on the insulating film 53 using a photolithography technique. Then, the manufacturing apparatus patterns the insulating film 53 using the resist pattern as a mask. After patterning the insulating film 53, the manufacturing apparatus removes the resist pattern. Next, the manufacturing apparatus performs RIE processing on the first semiconductor substrate 11 using the patterned insulating film 53 as a hard mask. Thus, a trench 141' is formed along the crystal orientation <111> direction on the front surface 11*a* side of the first semiconductor substrate 11. Since the trench 141' is formed by dry etching, crystal defects (etching damage) due to processing occur on side surfaces of the trench 141'.

Next, as illustrated in step ST13 of FIG. 9, the manufacturing apparatus further patterns the insulating film 53 using the photolithography technique to form openings 531 in the insulating film 53.

Figure 11A:
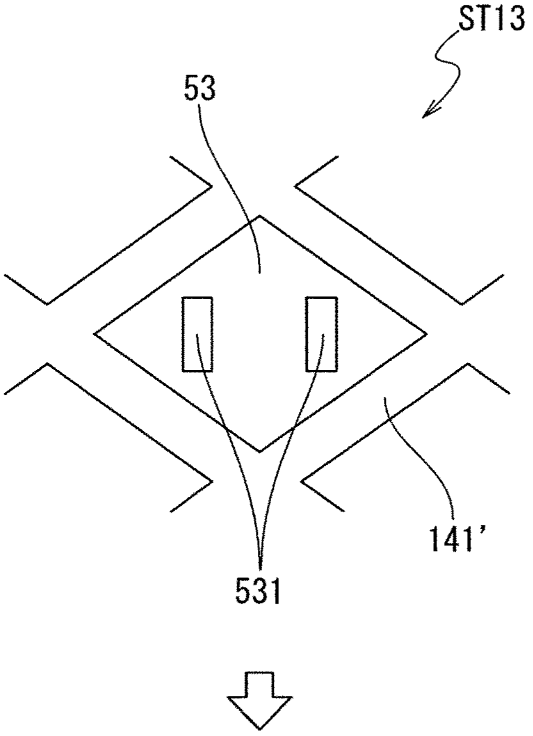
FIG. 11A is a plan view illustrating a position of an opening formed in step ST13 of FIG. 9.

FIG. 11A is a plan view illustrating a position of the openings 531 formed in step ST13 of FIG. 9. As illustrated in FIG. 11A, in step ST13, the manufacturing apparatus forms the openings 531 at a position overlapping the sensor pixel 112 in the insulating film 53 in plan view.

Next, in step ST13 of FIG. 9, the manufacturing apparatus wet-etches the first semiconductor substrate 11 with an alkaline chemical solution. In wet etching using an alkaline chemical solution, the etching rate largely depends on the crystal orientation, and etching does not proceed in the <111> direction, so that the trench 141 having a vertical and flat cross-sectional shape along the (111) plane is obtained regardless of the shape after RIE. Each of the side surfaces 141*c* and bottom surface 141*d* of the trench 141 is the (111) plane. This etching is substantially stopped when the flat (111) plane is formed, and thus has good stability. In addition, an effect of removing crystal defects generated by RIE is also obtained.

Furthermore, in step ST14 of FIG. 10, the openings 531 are provided in the insulating film 53 used as a hard mask. Thus, an uneven portion 13 is formed on the back surface 11*b* side of the first semiconductor substrate 11.

Figure 11B:
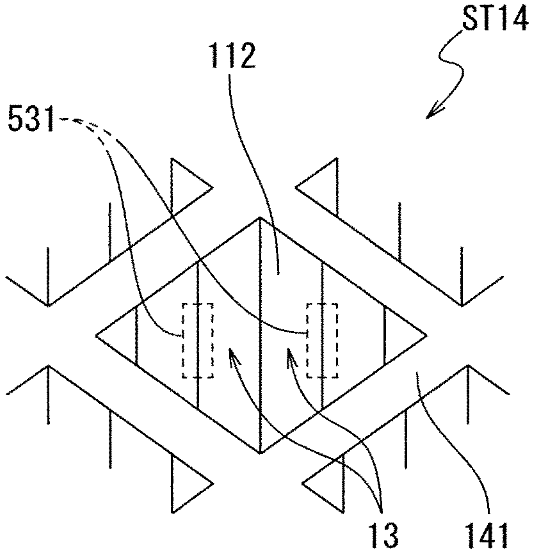
FIG. 11B is a plan view illustrating an uneven portion formed in step ST14 of FIG. 10.
Figure 11C:
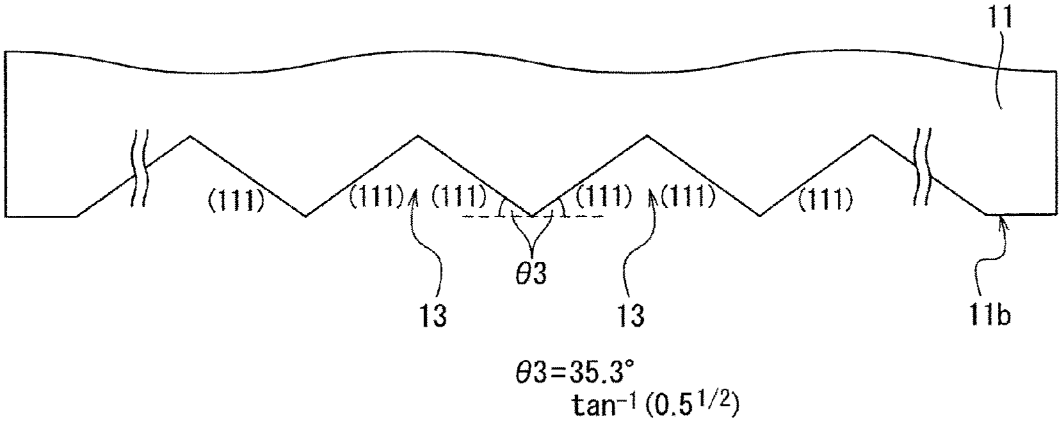
FIG. 11C is an enlarged view illustrating a cross section of the uneven portion.

FIG. 11B is a plan view illustrating the uneven portion 13 formed in step ST14 of FIG. 10. FIG. 11C is an enlarged view illustrating a cross section of the uneven portion 13. As illustrated in FIG. 11B, the uneven portion 13 is formed at a position overlapping the sensor pixel 112 in plan view.

Since the (110) Si wafer is used for the first semiconductor substrate 11, etching does not proceed in the <111> direction. Thus, as illustrated in FIG. 11C, the surface of the uneven portion 13 is the (111) plane inclined with respect to the back surface 11*b* of the first semiconductor substrate 11. An inclination angle θ3 of the surface that is inclined (hereinafter, the inclined surface) with respect to the back surface 11*b* is 35.3°. The cross-sectional shape of the uneven portion 13 is a corrugated shape in which inclined surfaces having an inclination angle of +θ3 are alternately continued. The uneven portion 13 functions as an antireflection portion. After the uneven portion 13 is formed, the manufacturing apparatus removes the insulating film 53.

Next, as illustrated in step ST15 of FIG. 10, the manufacturing apparatus forms the fixed charge film 142 on the entire back surface 11*b* of the first semiconductor substrate 11 including the side surfaces 141*c* and the bottom surface 141*d* of the trench 141 and the inclined surface on the inner side of the uneven portion 13. Next, the manufacturing apparatus forms the buried film 143 in the trench 141 and in the recess of the uneven portion 13.

Next, as illustrated in step ST16 of FIG. 10, the manufacturing apparatus forms the light shielding film SF and the color filter CF on the back surface 11*b* side of the first semiconductor substrate 11. Then, the manufacturing apparatus attaches the on-chip lens OCL to the color filter CF. Through the above steps, the imaging device 100 is completed.

Second Embodiment

Figure 12:
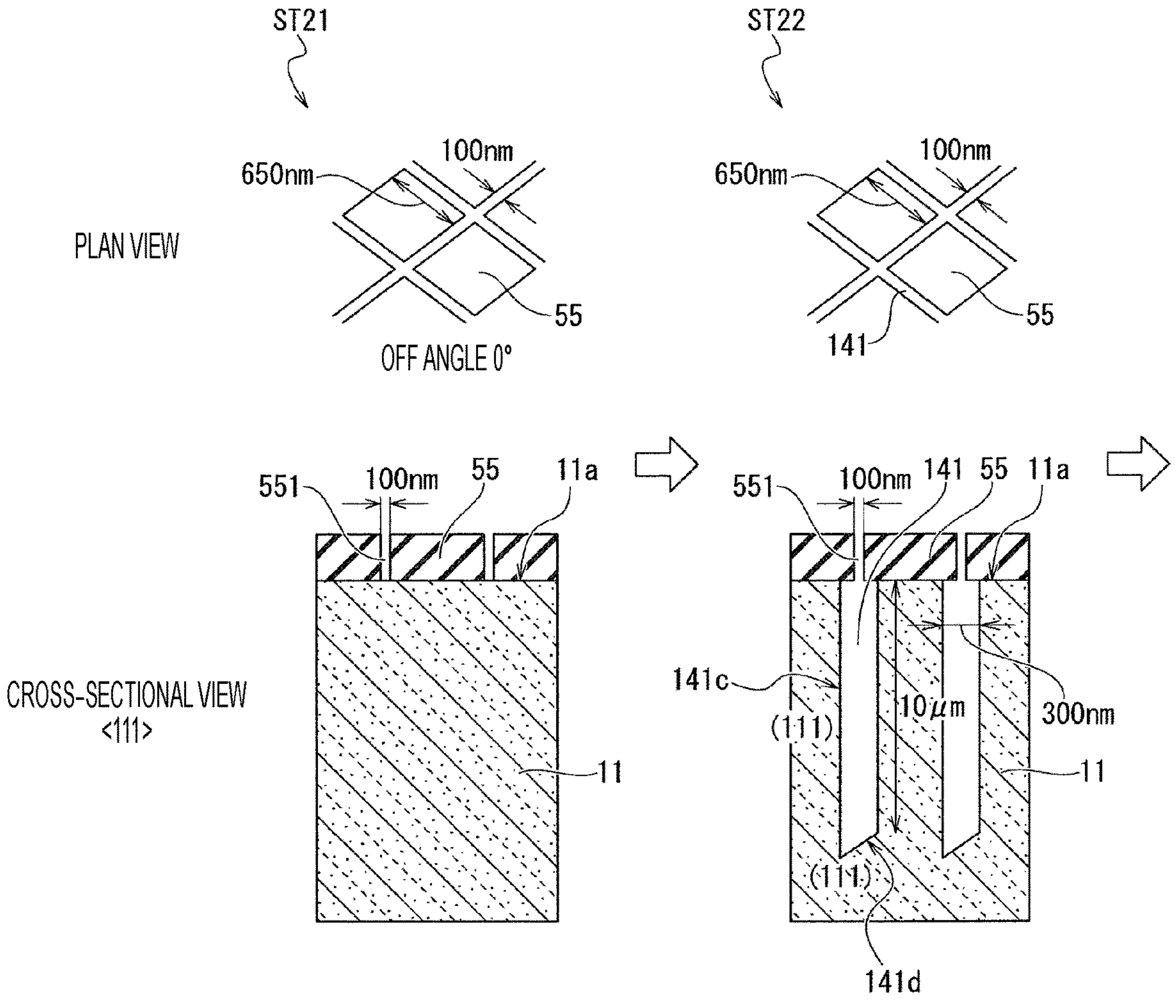
FIG. 12 is a view illustrating a manufacturing method for an inter-pixel isolation portion according to a second embodiment of the present disclosure in order of processes.
Figure 13:
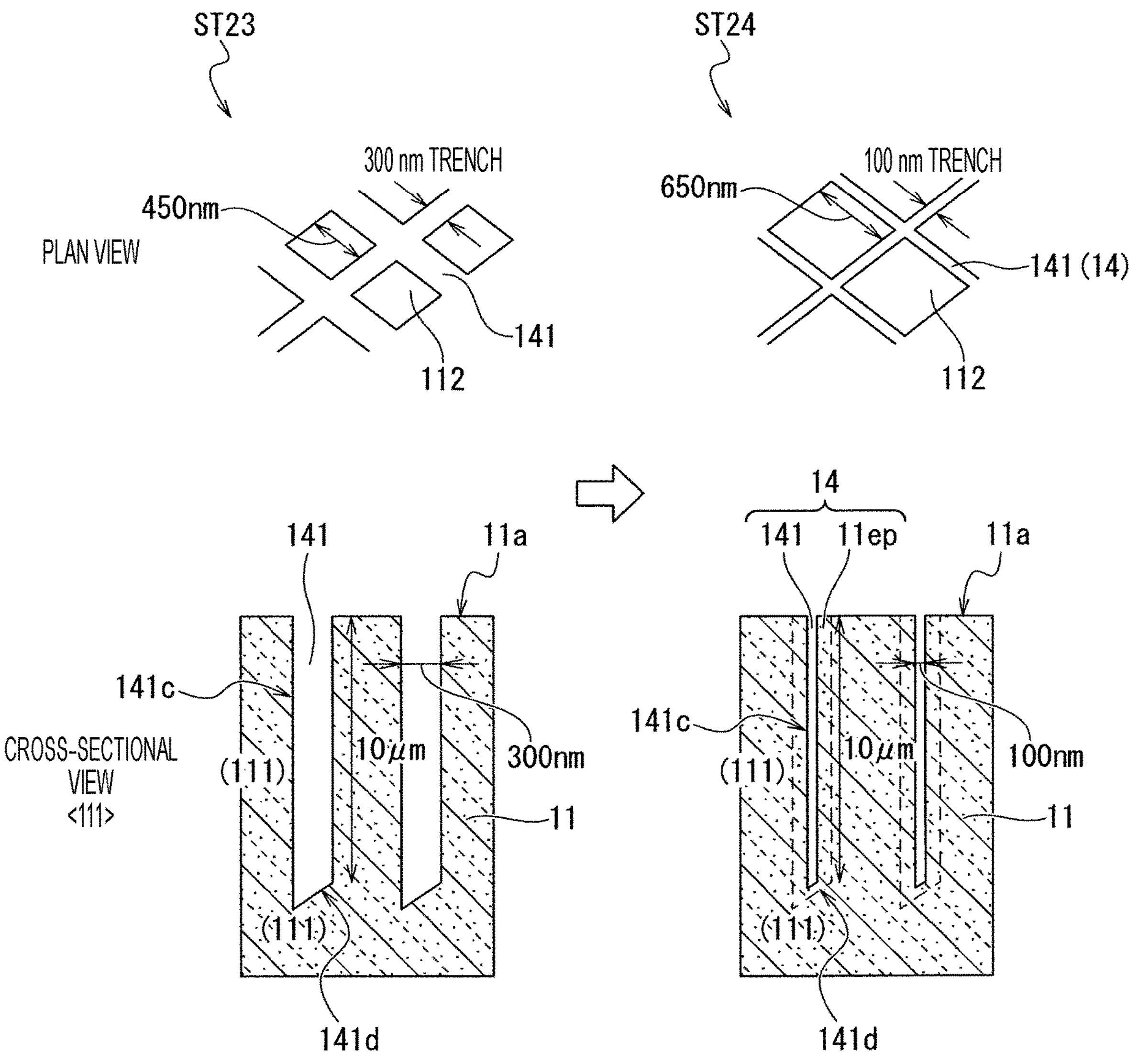
FIG. 13 is a view illustrating the manufacturing method for the inter-pixel isolation portion according to the second embodiment of the present disclosure in order of processes.

In the first embodiment described above, it has been described that the trench 141 of the inter-pixel isolation portion 14 is formed by performing dry etching such as RIE and then performing wet etching using an alkaline chemical solution. However, in the embodiment of the present disclosure, the method for forming the trench 141 is not limited thereto. In the embodiment of the present disclosure, the trench 141 may be formed only by wet etching using an alkaline chemical solution. FIGS. 12 and 13 are views illustrating a manufacturing method for the inter-pixel isolation portion 14 according to a second embodiment of the present disclosure in order of processes. In each of steps ST21 to ST24 illustrated in FIGS. 12 and 13, the upper view is a plan view, and the lower view is a cross-sectional view.

Also in the second embodiment, the (110) Si wafer in which the crystal plane of the front surface 11*a* is the (110) plane is used as the first semiconductor substrate 11. However, in the present embodiment, a substrate in which the front surface of the wafer is exactly (110) (off angle is 0°) is used. In step ST1 of FIG. 5, the manufacturing apparatus dry-etches the front surface 11*a* of the first semiconductor substrate 11 along the crystal orientation <111> direction (that is, along the (111) plane) so that the planar shape of the sensor pixel 12 is a rhombus shape (see FIGS. 4A and 4B).

As illustrated in step ST21 of FIG. 12, the manufacturing apparatus forms an insulating film 55 of SiN, $SiO_2$, or the like on the first semiconductor substrate 11. Next, the manufacturing apparatus patterns the insulating film 55 using a photolithography technique to form openings 551 having a width of about 100 nm in the insulating film 55.

Next, as illustrated in step ST22 of FIG. 12, the manufacturing apparatus performs anisotropic wet etching on the front surface 11*a* of the first semiconductor substrate 11 with an alkaline chemical solution using the insulating film 55 provided with the openings 551 as a hard mask. As the alkaline chemical solution, for example, a potassium hydroxide (KOH) solution equal to or more than 25 wt % and equal to or less than 35 wt % is used. By this anisotropic wet etching, the trench 141 having a width of about 300 nm and a depth of about 10 μm is formed.

In the anisotropic wet etching, the (110) plane is more easily etched than the (111) plane, and the etching speed ratio of the (110) plane to the (111) plane is equal to or more than 100 times. For example, the etching rate of the (110) plane of 25 wt % KOH solution is about 1.4 μm/min. Since the trench 141 is formed by wet etching, crystal defects (etching damage) such as dry etching do not occur. Next, as illustrated in step ST23 of FIG. 13, the manufacturing apparatus removes the insulating film 55 (hard mask) from the front surface 11*a* of the first semiconductor substrate 11.

Next, as illustrated in step ST24 of FIG. 13, the manufacturing apparatus forms a non-doped Si epitaxy layer 11*ep* in the trench 141 by an epitaxial growth method to narrow the width of the trench 141. For example, the trench 141 is filled with the Si epitaxy layer 11*ep* so that the width of the trench 141 is about 100 nm.

Since the epitaxial growth method is a mode of growth in which Si is arranged in alignment with the crystal plane of the underlying layer, the surface of the Si epitaxy layer 11*ep* becomes a (111) plane. That is, each of the side surfaces 141*c* and the bottom surface 141*d* of the trench 141 after formation of the Si epitaxy layer 11*ep* is the (111) plane. Thus, the inter-pixel isolation portion 14 including the trench 141 is completed.

Effects of Second Embodiment

In the manufacturing method for the imaging device 100 according to the second embodiment, the trench 141 of the inter-pixel isolation portion 14 is formed only by wet etching using an alkaline solution without using dry etching. In the wet etching, since the etching chemically proceeds, it is possible to suppress occurrence of crystal defects on the side surfaces 141*c* of the trench 141. When the trench 141 is formed, it is possible to suppress generation of defects related to an etching gas (fluorine, carbon, bromine, and the like) by RIE. Thus, the imaging device 100 can reduce dark current and white spots caused by crystal defects.

Modification 1

In the second embodiment of the present disclosure, a p-type Si epitaxy layer may be formed in the trench 141, and the side surfaces 11*c* of the trench 141 may be doped to be p-type. In addition, after the p-type Si epitaxy layer is formed, a light shielding film or the like may be embedded in the trench 141.

Figure 14:
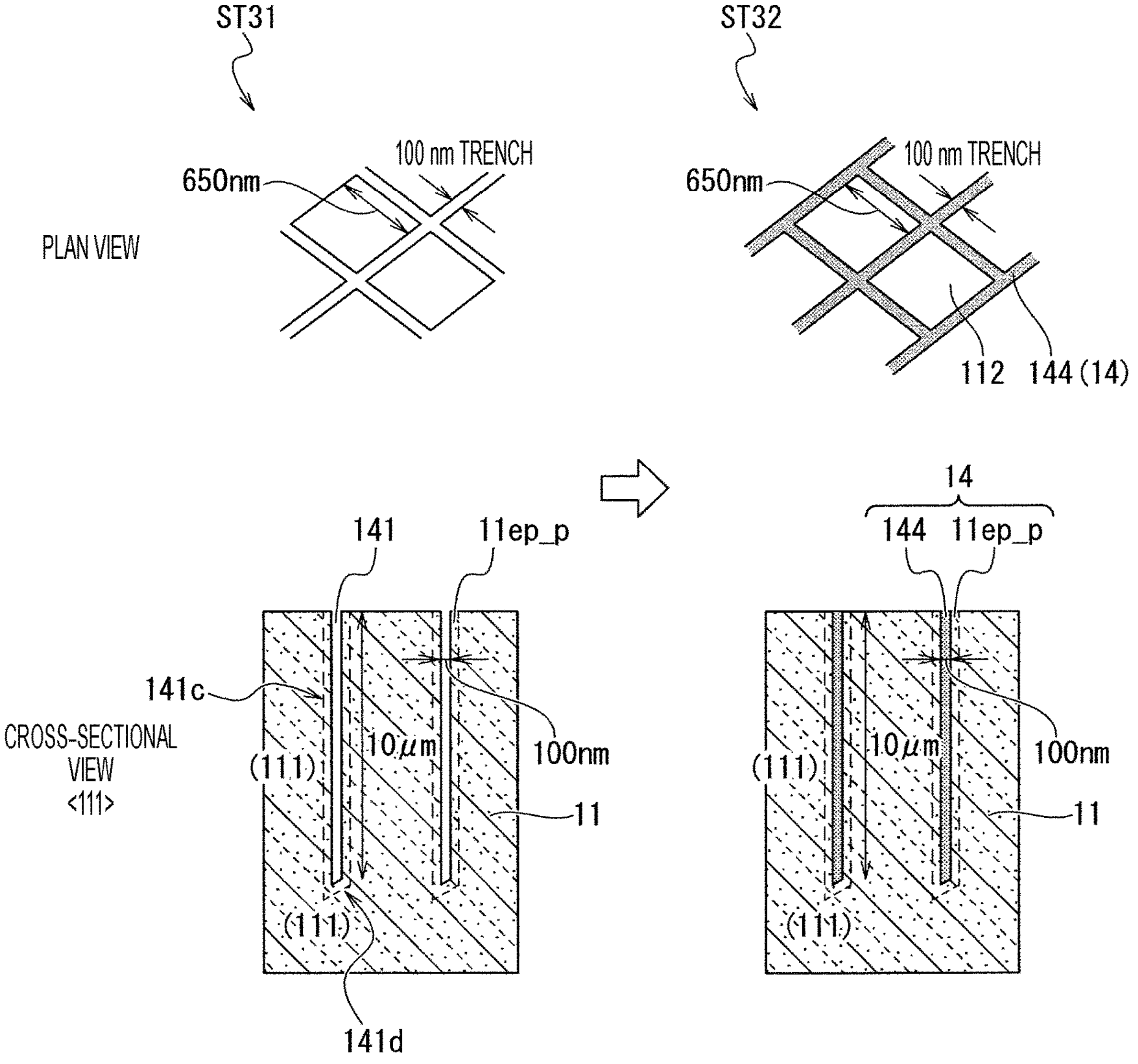
FIG. 14 is a view illustrating a manufacturing method for the inter-pixel isolation portion according to Modification 1 of the second embodiment of the present disclosure in order of processes.

FIG. 14 is a view illustrating a manufacturing method for the inter-pixel isolation portion 14 according to Modification 1 of the second embodiment of the present disclosure in order of processes. In each of steps ST31 and ST32 illustrated in FIG. 14, the upper view is a plan view, and the lower view is a cross-sectional view.

In Modification 1 of the second embodiment, the process (step ST23) of forming the trench 141 having a width of about 300 nm and a depth of about 10 μm is the same as the manufacturing method described with reference to FIGS. 12 and 13.

In Modification 1 of the second embodiment, as illustrated in step ST31 of FIG. 14, the manufacturing apparatus forms a p-type Si epitaxy layer 11*ep_p* (an example of an "epitaxial film" of the present disclosure) in the trench 141 by an epitaxial growth method to narrow the width of the trench 141. For example, the trench 141 is filled with the p-type Si epitaxy layer 11*ep_p* such that the width of the trench 141 is about 100 nm. Thus, the side surfaces 141*c* and the bottom surface 141*d* of the trench 141 are doped to be p-type. The side surfaces 141*c* of the trench 141 are doped to be p-type to suppress defects.

Next, as illustrated in step ST31 of FIG. 14, the manufacturing apparatus buries the light shielding film 144 in the trench 141. Thus, the inter-pixel isolation portion 14 including the trench 141, the p-type Si epitaxy layer 11*ep_p* covering the side surfaces 141*c* and the bottom surface 141*d* of the trench 141, and the light shielding film 144 embedded in the trench 141 via the p-type Si epitaxy layer 11*ep_p* is completed.

According to Modification 1 of the second embodiment, since the inter-pixel isolation portion 14 includes the light shielding film 144, color mixing between adjacent sensor pixels 112 can be suppressed.

Furthermore, the side surfaces 141*c* of the trench 141 suppress occurrence of crystal defects and have a flat shape, so that diffusion of p-type impurities becomes more uniform. By forming the p-type Si epitaxy layer 11*ep_p* on the side surfaces 141*c*, an ideal impurity profile can be obtained. Thus, the imaging device 100 can further suppress crystal defects and further reduce dark current and white spots caused by the crystal defects.

Modification 2

Figure 15:
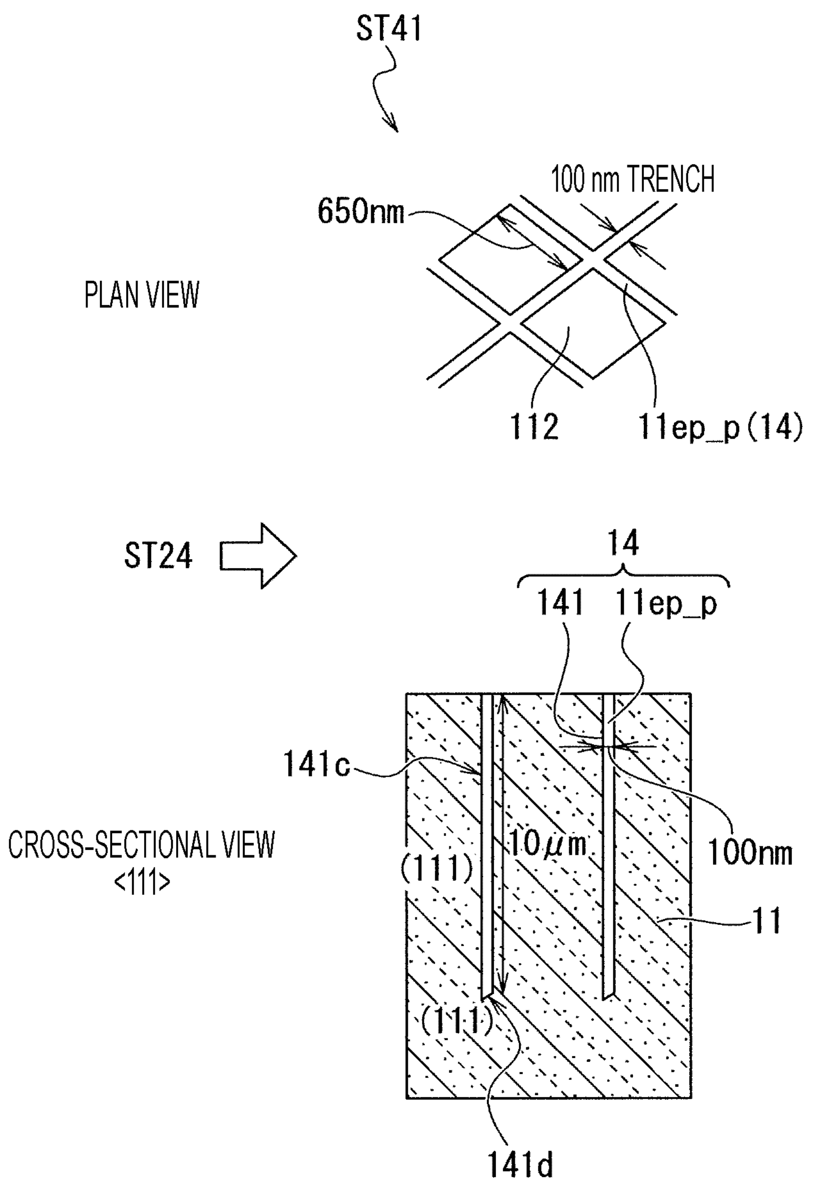
FIG. 15 is a view illustrating a manufacturing method for an inter-pixel isolation portion according to Modification 2 of the second embodiment of the present disclosure.

In the second embodiment of the present disclosure, the trench 141 may be filled with a p-type Si epitaxy layer. FIG. 15 is a view illustrating a manufacturing method for the inter-pixel isolation portion 14 according to Modification 2 of the second embodiment of the present disclosure. In step ST41 illustrated in FIG. 15, the upper view is a plan view, and the lower view is a cross-sectional view.

The manufacturing method described with reference to FIGS. 12 and 13 is the same up to the step (step ST24) of forming the trench 141 having a width of about 300 nm and a depth of about 10 μm, forming the non-doped Si epitaxy layer 11*ep* in the trench 141, and setting the width of the trench 141 to 100 nm in Modification 2 of the second embodiment.

In Modification 2 of the second embodiment, as illustrated in step ST41 of FIG. 15, the manufacturing apparatus forms the p-type Si epitaxy layer 11*ep_p* in the trench 141 by an epitaxial growth method to embed the trench 141. Thus, the inter-pixel isolation portion 14 including the trench 141 and the p-type Si epitaxy layer 11*ep_p* embedded in the trench 141 is completed.

According to Modification 2 of the second embodiment, similarly to Modification 1 of the second embodiment, the imaging device 100 can further suppress crystal defects, and can further reduce dark current and white spots caused by the crystal defects.

Third Embodiment

In the embodiment of the present disclosure, (110) substrate not only the inter-pixel isolation portion but also the intra-pixel isolation portion may be formed by performing wet etching using an alkaline chemical solution on the substrate. Furthermore, the intra-pixel isolation portion may have a hollow trench separated from each of the front surface and the back surface of the (110) substrate.

Configuration Example

Figure 16:
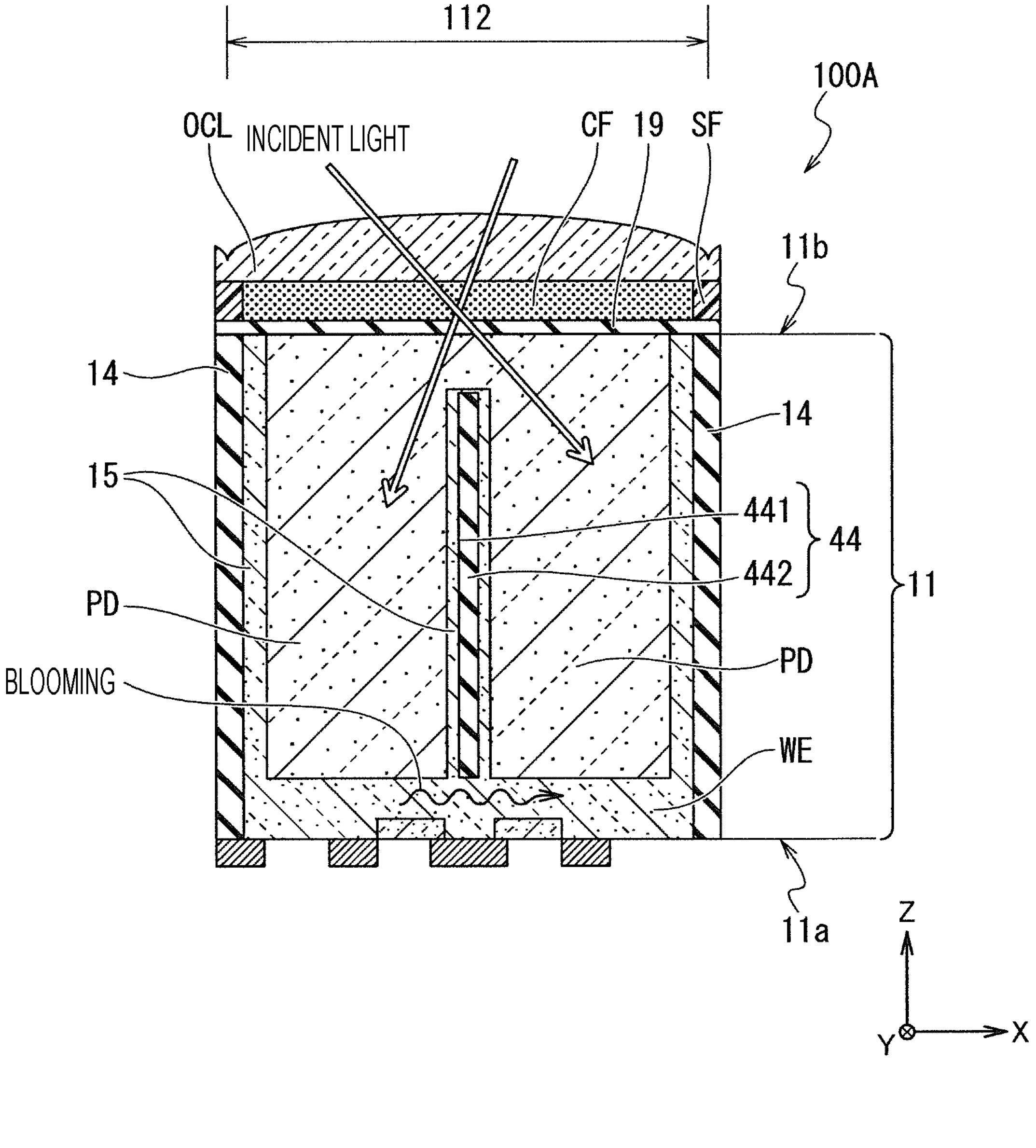
FIG. 16 is a cross-sectional view illustrating a configuration example of an imaging device according to a third embodiment of the present disclosure.

FIG. 16 is a cross-sectional view illustrating a configuration example of an imaging device 100A according to the third embodiment of the present disclosure. As illustrated in FIG. 16, an imaging device 100A according to the third embodiment is, for example, a back-illuminated imaging device, and includes a plurality of sensor pixels 112. Furthermore, each of the plurality of sensor pixels 112 is provided with an intra-pixel isolation portion 44 that separates the inside of the sensor pixel 112 into a plurality of regions (for example, as illustrated in FIG. 16, two left and right regions).

The intra-pixel isolation portion 44 includes a trench (hereinafter, a hollow trench; an example of "trench" of the present disclosure) 441 having a hollow structure provided in the first semiconductor substrate 11 and a buried film 442 buried in the hollow trench 441. The hollow trench 441 is a hollow portion separated from each of the front surface 11*a* and the back surface 11*b* of the first semiconductor substrate 11 in the sensor pixel 112.

The type of the buried film 442 is not particularly limited, and is, for example, amorphous Si excellent in embeddability. The amorphous Si may be non-doped amorphous Si, p-type amorphous Si, or a film obtained by stacking them (for example, a film in which p-type amorphous Si is stacked on non-doped amorphous Si). In a case where the first semiconductor substrate 11 is a Si substrate, if amorphous Si having a thermal expansion coefficient close to that of the Si substrate is used as the buried film 143, subsequent defect generation can also be suppressed.

Furthermore, since one end portion (in FIG. 16, the lower end) of the intra-pixel isolation portion 44 and the front surface 11*a* of the first semiconductor substrate 11 are separated from each other, a blooming path can be formed between one region and the other region separated from each other by the intra-pixel isolation portion 44. For example, the blooming path is formed in single crystal Si, and is formed in the well region WE, for example.

Thus, a barrier height between one region and the other region can be reduced in the sensor pixel 112. The electric charge exceeding the capacity that can be accumulated in one region in the sensor pixel can flow to the other region through the blooming path. It is possible to prevent a signal output difference in the sensor pixel 112 from becoming extremely large. In addition, since the electric charge is movable through the blooming path, overflow of the electric charge from one sensor pixel 112 to the other sensor pixel 112 adjacent to each other can be suppressed. Thus, it is possible to suppress occurrence of a defect (for example, white floating) in the output of the sensor pixel 112 due to the overflow. From the above, imaging performance can be improved.

Furthermore, the other end portion (in FIG. 16, the upper end) of the intra-pixel isolation portion 44 and the back surface 11*b* (light-receiving surface) of the first semiconductor substrate 11 are separated from each other. Thus, the incident light condensed by the on-chip lens OCL hits the upper end of the intra-pixel isolation portion 44, and scattering of the incident light in the sensor pixel 112 can be suppressed. Furthermore, since scattering of the incident light in the sensor pixel 112 can be suppressed, color mixing between one region and the other region in the sensor pixel 112 can be suppressed.

Figure 17:
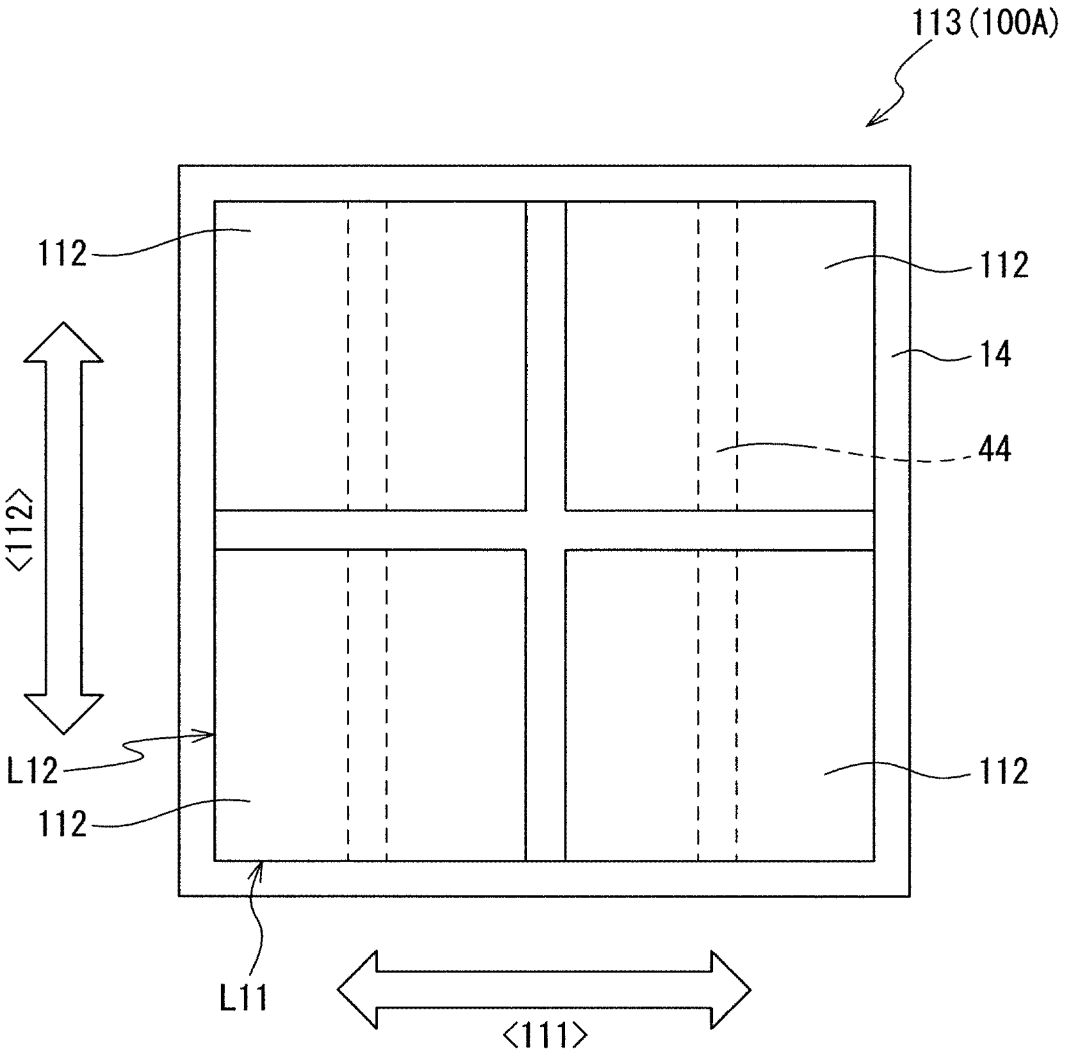
FIG. 17 is a plan view illustrating a configuration example of a pixel region of the imaging device according to the third embodiment of the present disclosure.

FIG. 17 is a plan view illustrating a configuration example of the pixel region 113 of the imaging device 100A according to the third embodiment of the present disclosure. FIG. 17 illustrates a planar shape of the plurality of sensor pixels 112 when the first semiconductor substrate 11 is viewed from the front surface 11*a* side. As illustrated in FIG. 17, the planar shape of the sensor pixel 112 is a square. Furthermore, a first side L11 constituting an outer periphery of the square is parallel to the crystal orientation <111> direction, and a second side L12 constituting the outer periphery of the square and orthogonal to the first side is parallel to a crystal orientation <112> direction. The inter-pixel isolation portions 14 extend in each of the crystal orientation <111> direction and <112> direction.

The intra-pixel isolation portion 44 extends in the crystal orientation <112> direction. The width direction of the intra-pixel isolation portion 44 is the <111> direction.

Figure 18:
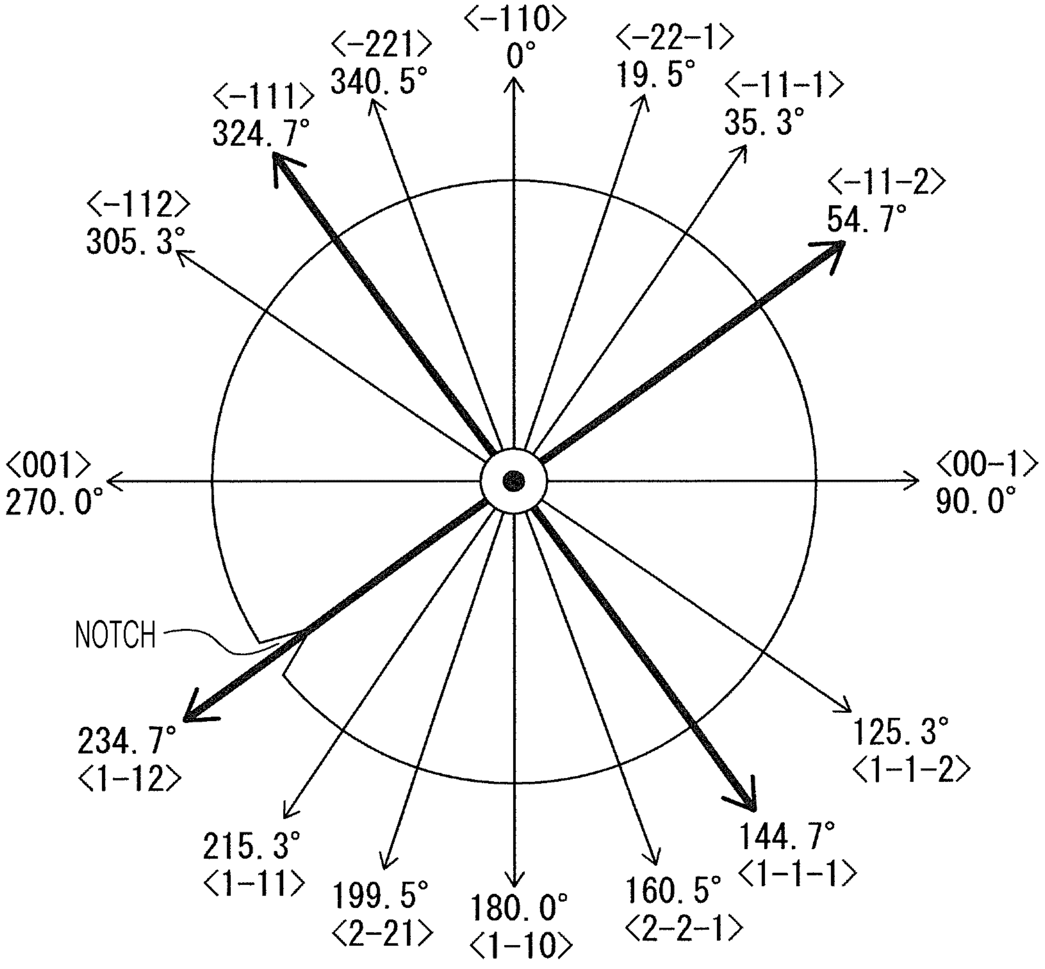
FIG. 18 is a plan view illustrating a relationship between a crystal orientation and a notch in a (110) Si wafer, and illustrates a crystal orientation <111> direction and a <112> direction emphasized with a thick line.

FIG. 18 is a plan view illustrating the relationship between the crystal orientation and the notch in the (110) Si wafer, and is a view illustrating the crystal orientation <111> direction and <112> direction emphasized with a thick line. As illustrated in FIG. 18, the crystal orientation <111> direction and <112> direction are orthogonal to each other in plan view.

(Manufacturing Method)

Next, a manufacturing method for the intra-pixel isolation portion 44 according to the third embodiment of the present disclosure will be described. FIGS. 19 to 26 are views illustrating the manufacturing method for the intra-pixel isolation portion 44 according to the third embodiment of the present disclosure in order of processes. In each of FIGS. 19 to 26, the upper view is a plan view, the middle view is a cross-sectional view of the upper view taken along line Y-Y', and the lower view is a cross-sectional view taken along line X-X'. The cross-sectional view taken along line Y-Y' is a cross-sectional view parallel to the <112> direction. The cross-sectional view taken along line X-X' is a cross-sectional view parallel to the <111> direction.

Figure 19:
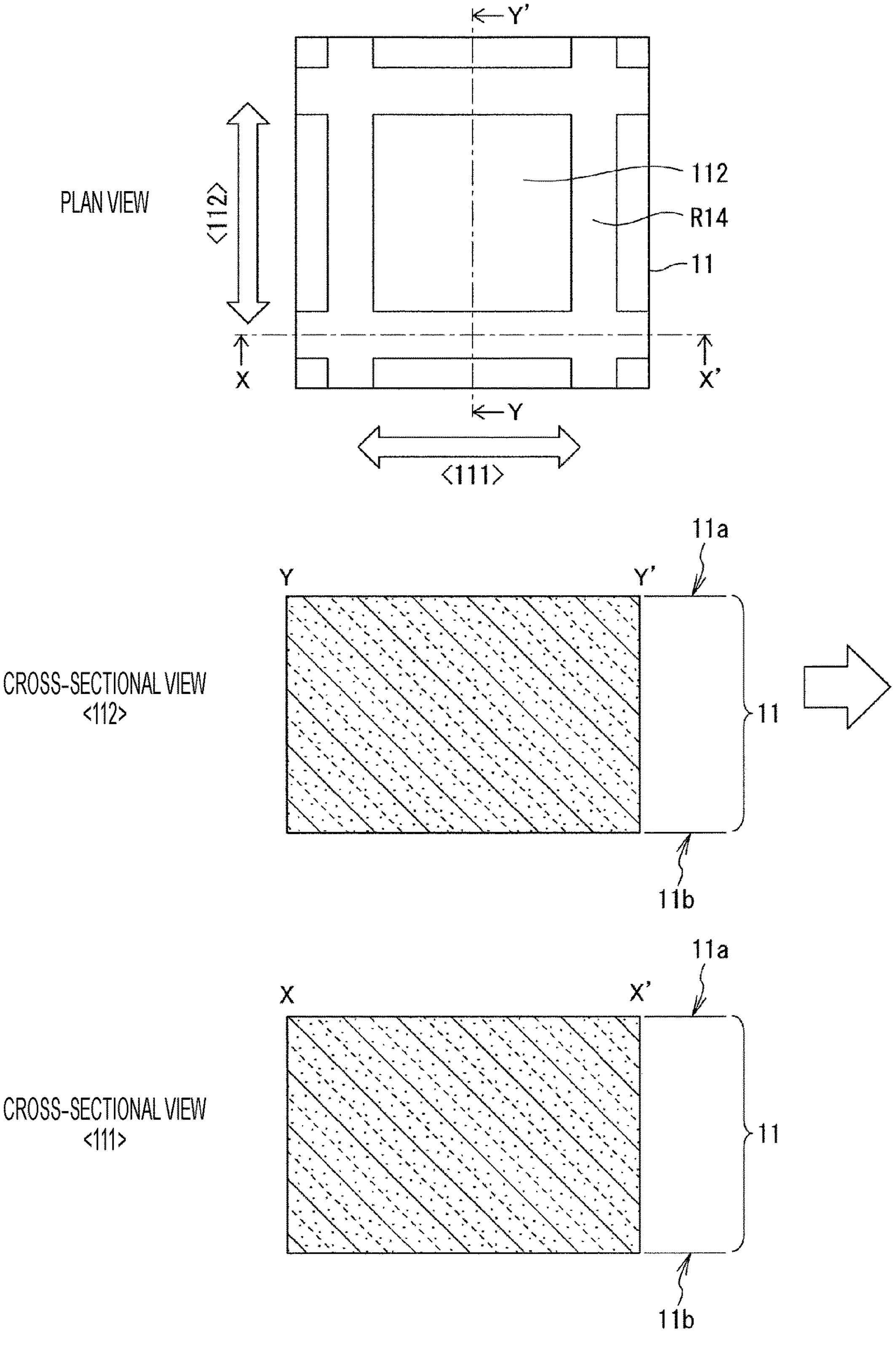
FIG. 19 is a view illustrating a manufacturing method for an intra-pixel isolation portion according to the third embodiment of the present disclosure in order of processes.
Figure 20:
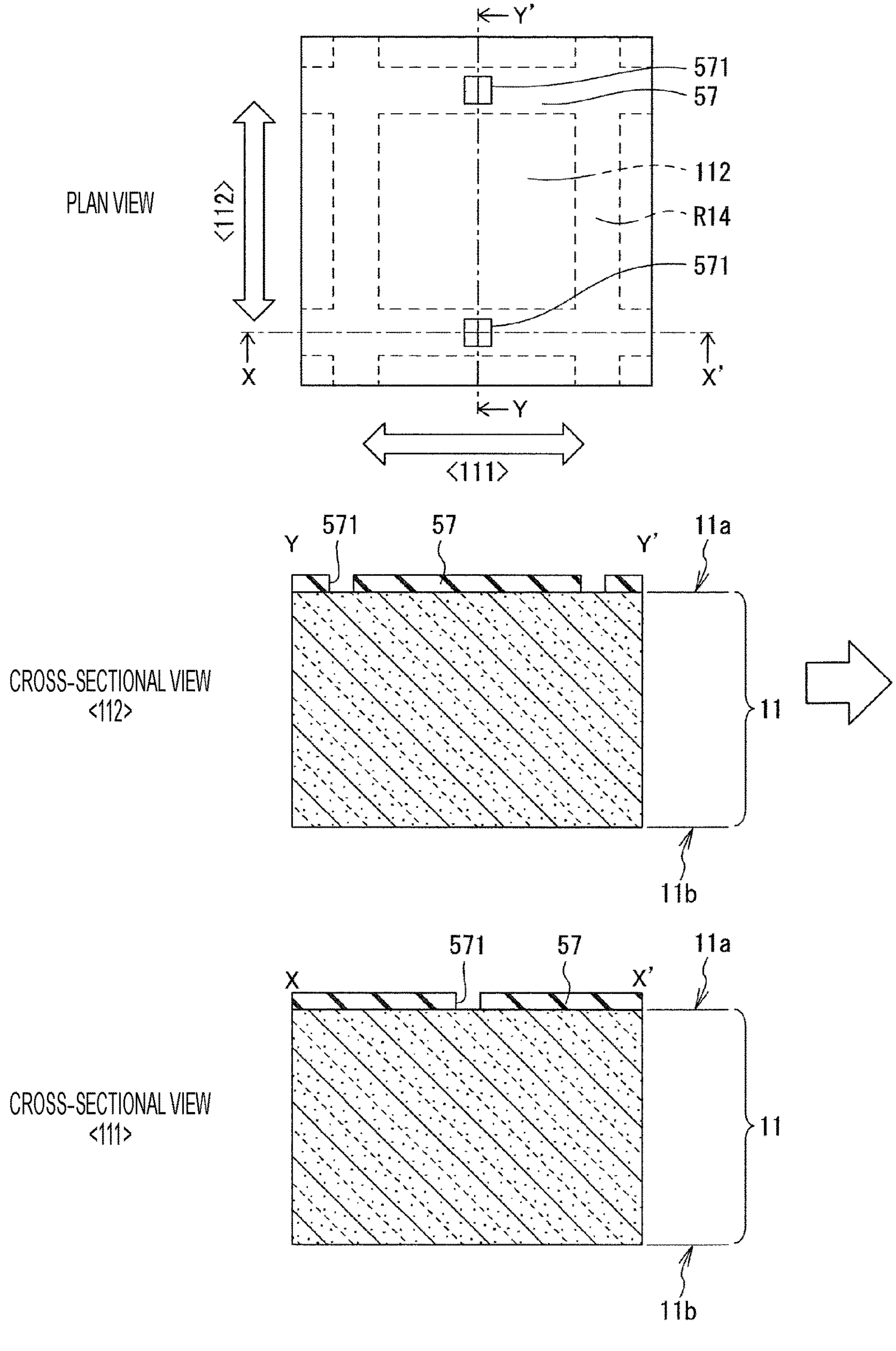
FIG. 20 is a view illustrating the manufacturing method for the intra-pixel isolation portion according to the third embodiment of the present disclosure in order of processes.

The first semiconductor substrate 11 illustrated in FIG. 19 is a (110) Si wafer in which the crystal plane of the front surface 11*a* is the (110) plane. As illustrated in FIG. 20, the manufacturing apparatus forms an insulating film 57 of $SiO_2$ or the like on the front surface 11*a* of the first semiconductor substrate 11. Next, the manufacturing apparatus forms a resist pattern (not illustrated) on the insulating film 57 using a photolithography technique. Then, the manufacturing apparatus patterns the insulating film 57 using the resist pattern as a mask.

Thus, the insulating film 57 has openings 571 above the region R14 where the inter-pixel isolation portion is formed, and is formed in a shape that covers the other regions. The openings 571 are through holes, and the front surface 11*a* of the first semiconductor substrate 11 is exposed from below the openings 571. The openings 531 are formed so as to face each other with the central portion of the sensor pixel 112 interposed therebetween in plan view. The direction in which the openings 531 face each other across the sensor pixel 112 is the crystal orientation <112> direction.

Note that, in the photolithography process for forming the openings 571 in the insulating film 57, the crystal orientation <111> direction and <112> direction can be specified using a notch previously provided in the (110) Si wafer. As illustrated in FIG. 18, in the (110) Si wafer, the direction of the straight line connecting the notch and the wafer center is, for example, the <1−12> crystal orientation. The crystal orientation <1−12> direction is a direction equivalent to the <112> direction.

Therefore, for example, by matching the direction of the straight line connecting the notch and the wafer center with the Y-axis direction, the crystal orientation <111> direction can be matched with the X-axis direction, and the crystal orientation <112> direction can be matched with the Y-axis direction. In this state, when exposure processing of photolithography is performed, the direction of the pattern side of the resist pattern is set to the X-axis direction and the Y-axis direction, that is, the <111> direction and the <112> direction. Then, by patterning the insulating film 57 using this resist pattern, openings 271 arranged as illustrated in FIG. 20 can be formed.

Figure 21:
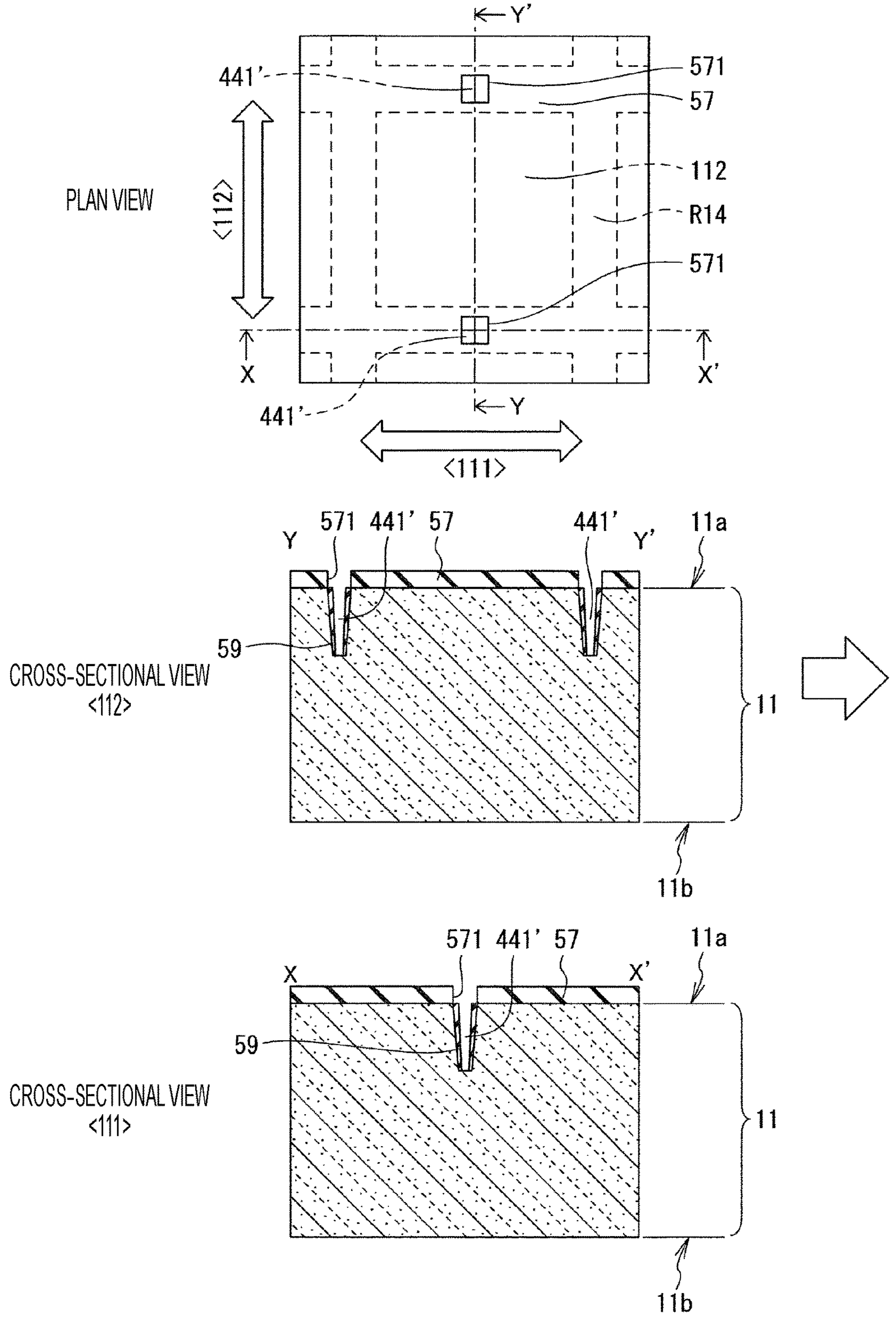
FIG. 21 is a view illustrating the manufacturing method for the intra-pixel isolation portion according to the third embodiment of the present disclosure in order of processes.

Next, as illustrated in FIG. 21, the front surface 11*a* of the first semiconductor substrate 11 is dry-etched using the insulating film 57 in which the openings 571 are formed as a hard mask to form non-penetrating openings 441' each having a bottom surface between the front surface 11*a* and the back surface 11*b* of the first semiconductor substrate 11. The dry etching is, for example, RIE.

Next, an insulating film 59 such as a silicon nitride film (SiN film) is formed on the front surface 110*a* of the first semiconductor substrate 11, and the formed insulating film 59 is etched back. Thus, the insulating film 57 is removed from above the insulating film 59 such as the $SiO_2$ film and from above the bottom surface of the openings 441'. The insulating film 59 is left only on the side surfaces of the openings 441'.

Figure 22:
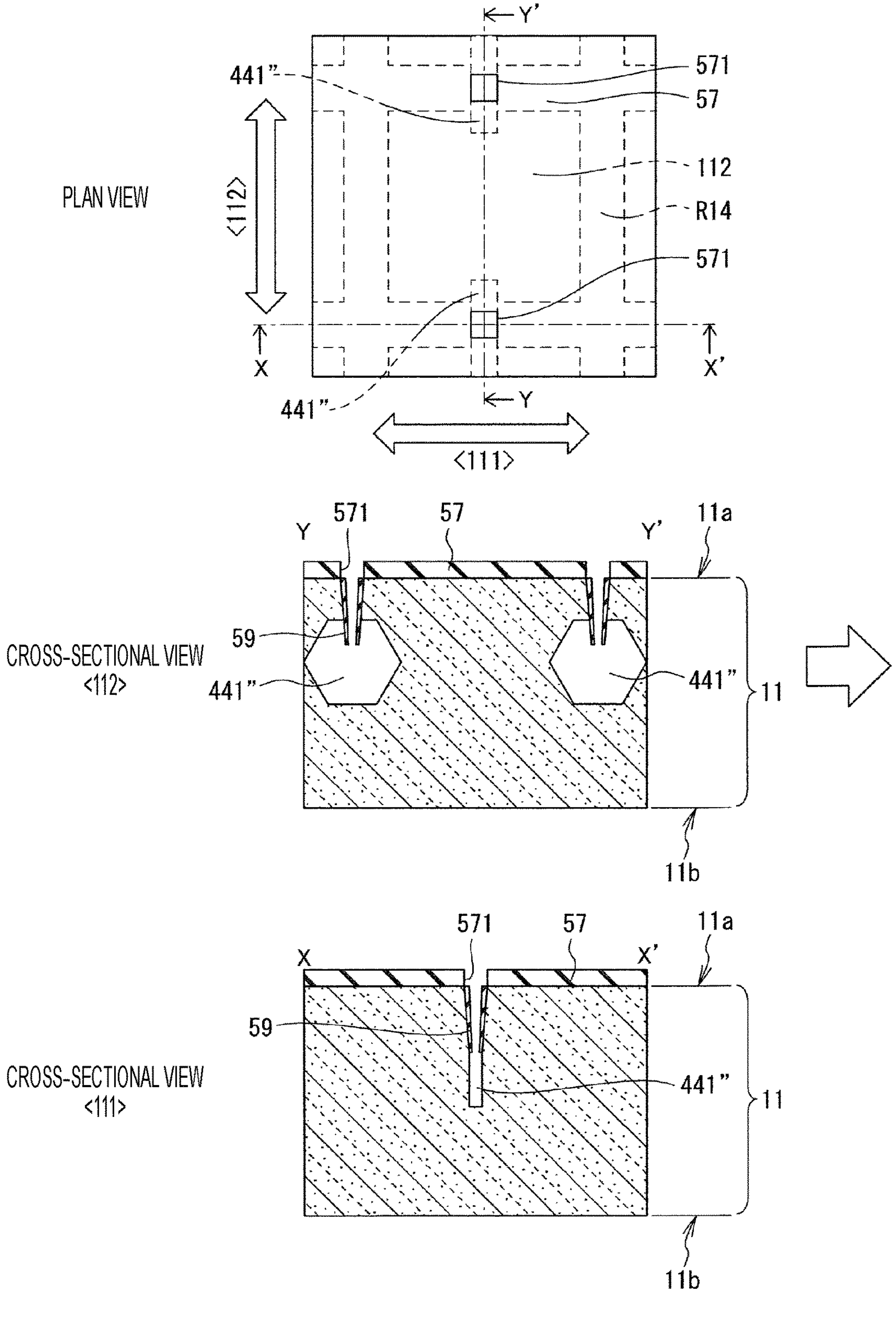
FIG. 22 is a view illustrating the manufacturing method for the intra-pixel isolation portion according to the third embodiment of the present disclosure in order of processes.

Next, as illustrated in FIG. 22, the manufacturing apparatus performs crystal anisotropic etching on the first semiconductor substrate 11 with a high-temperature alkaline solution using the insulating films 57 and 59 as hard masks. As the alkaline solution, for example, ammonium hydroxide (NH4OH), potassium hydroxide (KOH), tetramethylammonium hydroxide (TMAH), or the like is used.

Alkali etching on a Si substrate (Si wafer) has different etching rates for each crystal orientation. Specifically, the etching proceeds uniformly in the <110> direction perpendicular to the front surface of the (110) Si wafer. The etching proceeds in the <112> direction among directions parallel to the front surface of the (110) Si wafer. On the other hand, the etching hardly proceeds in the <111> direction among the directions parallel to the front surface of the (110) Si wafer. Thus, rhombic hollow trenches 441" are formed inside the first semiconductor substrate 11.

Figure 23:
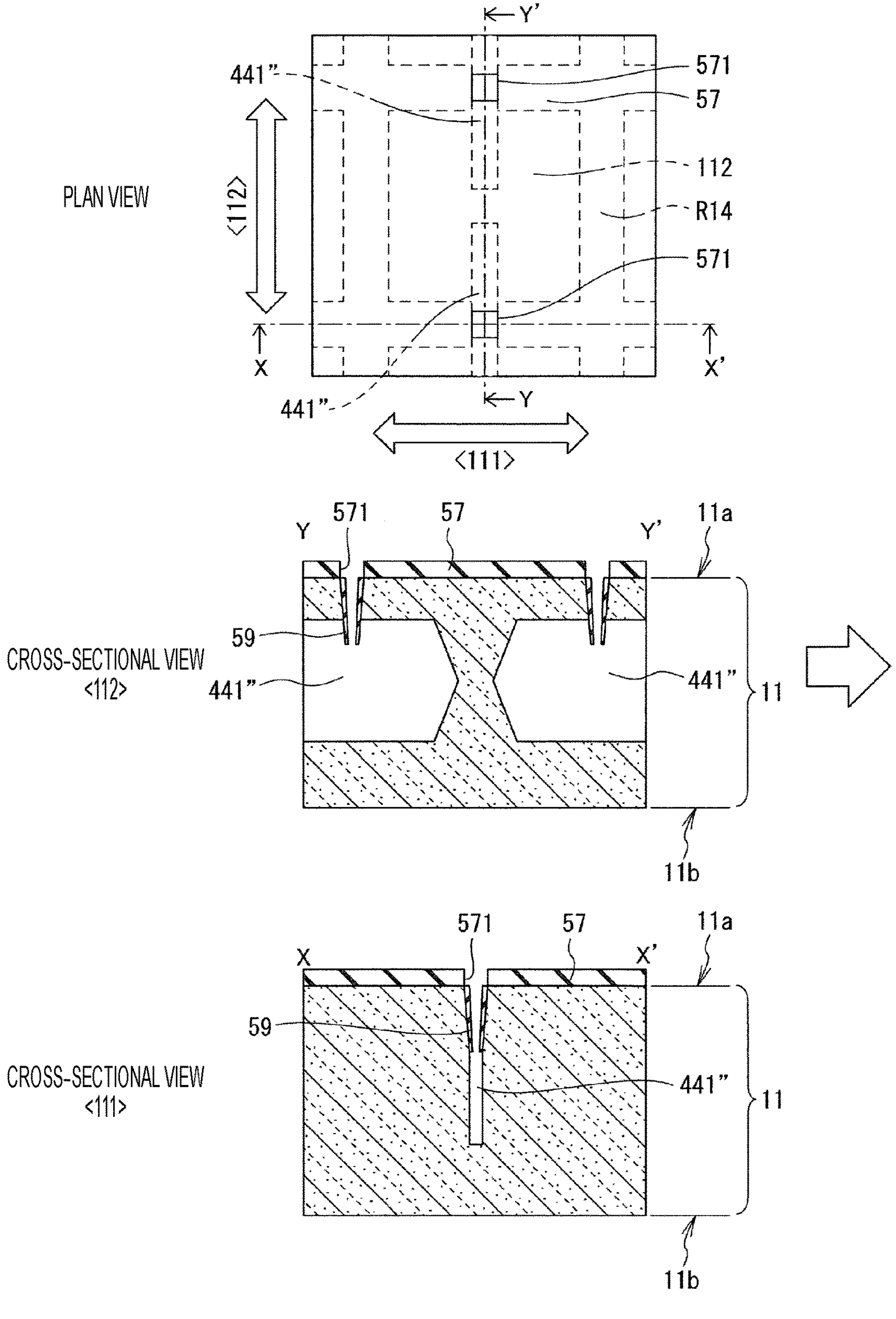
FIG. 23 is a view illustrating the manufacturing method for the intra-pixel isolation portion according to the third embodiment of the present disclosure in order of processes.
Figure 24:
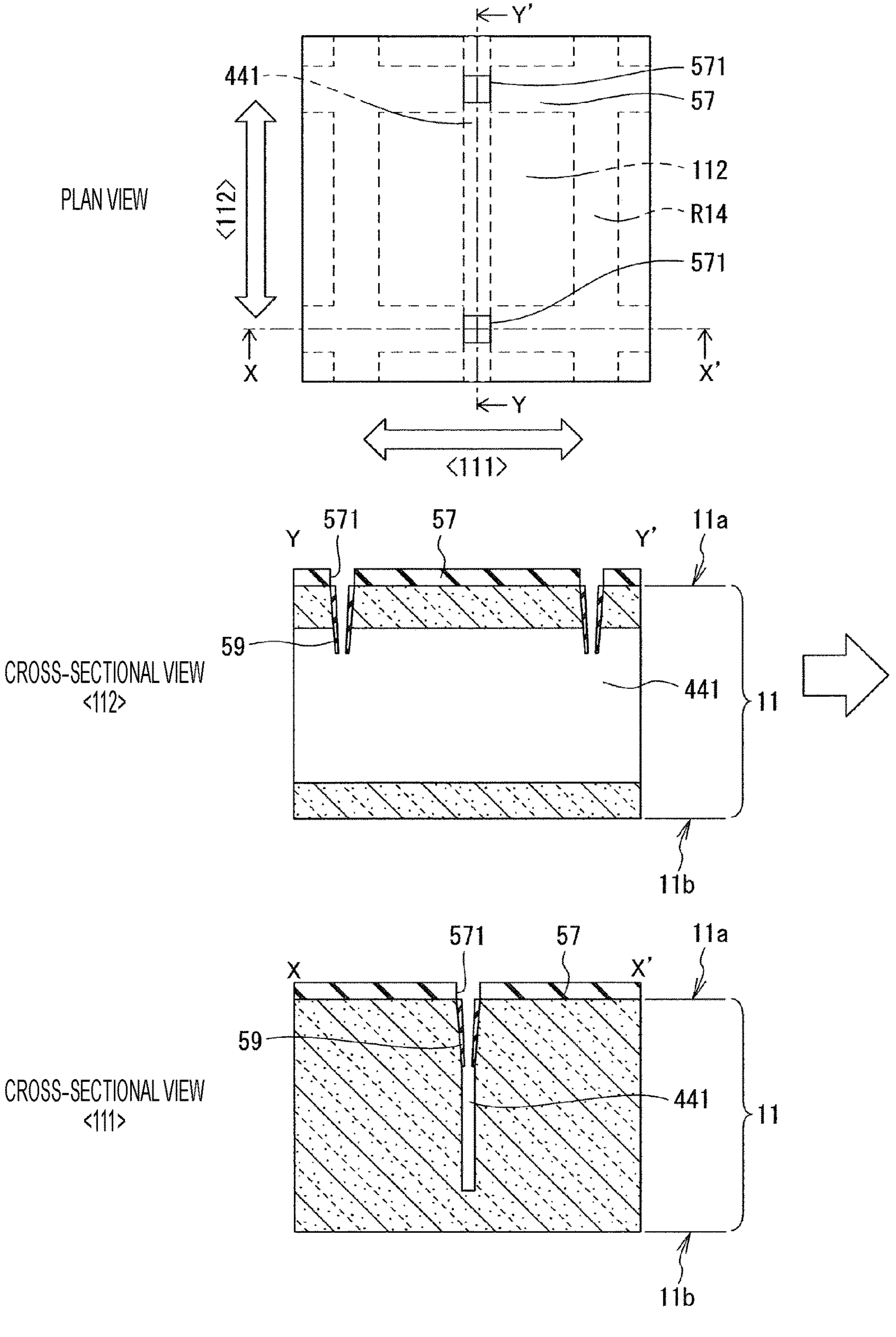
FIG. 24 is a view illustrating the manufacturing method for the intra-pixel isolation portion according to the third embodiment of the present disclosure in order of processes.

As the etching of FIG. 22 proceeds, the rhombus-shaped hollow trenches 441" adjacent in the <112> direction approach each other, as illustrated in FIG. 23. Then, the rhombic hollow trenches 441" are connected to each other to form the hollow trench 441 that separates the inside of the sensor pixel 112 as illustrated in FIG. 24.

Figure 25:
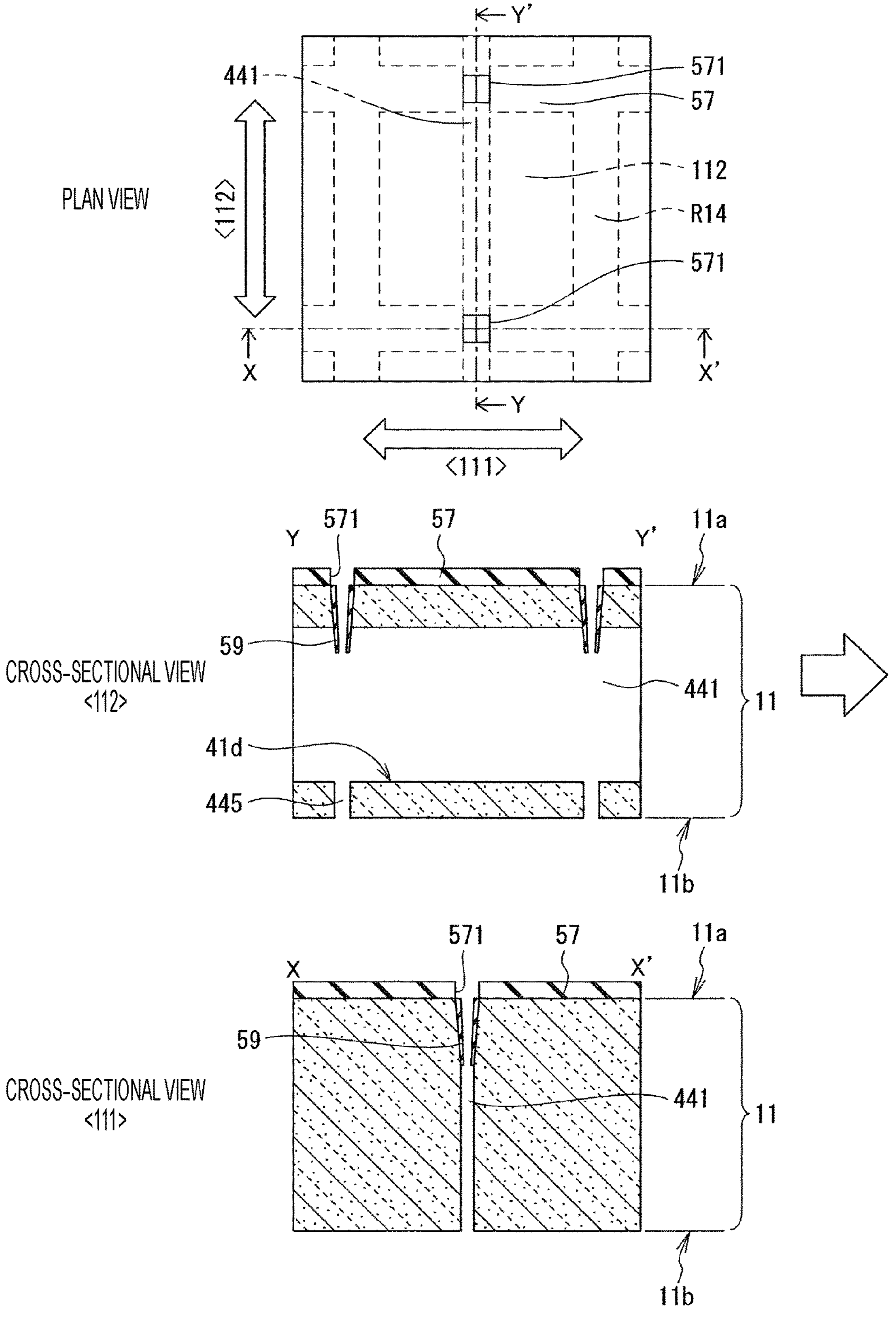
FIG. 25 is a view illustrating the manufacturing method for the intra-pixel isolation portion according to the third embodiment of the present disclosure in order of processes.

Next, the manufacturing apparatus performs dry etching on the first semiconductor substrate 11 using the insulating films 57 and 59 as masks. Thus, as illustrated in FIG. 25, a portion of a bottom surface 441*d* of the hollow trench 441 located immediately below the openings 571 is etched, and openings 445 penetrating between the bottom surface 41*d* of the hollow trench 441 and the back surface 11*b* of the first semiconductor substrate 11 are formed.

Next, the manufacturing apparatus etches and removes the insulating films 57 and 59. For example, the insulating film 57 such as the $SiO_2$ film is removed by wet etching using a solution containing hydrofluoric acid. The insulating film 59 such as a SiN film is removed by wet etching using a solution containing phosphoric acid ($H_3PO_4$).

Figure 26:
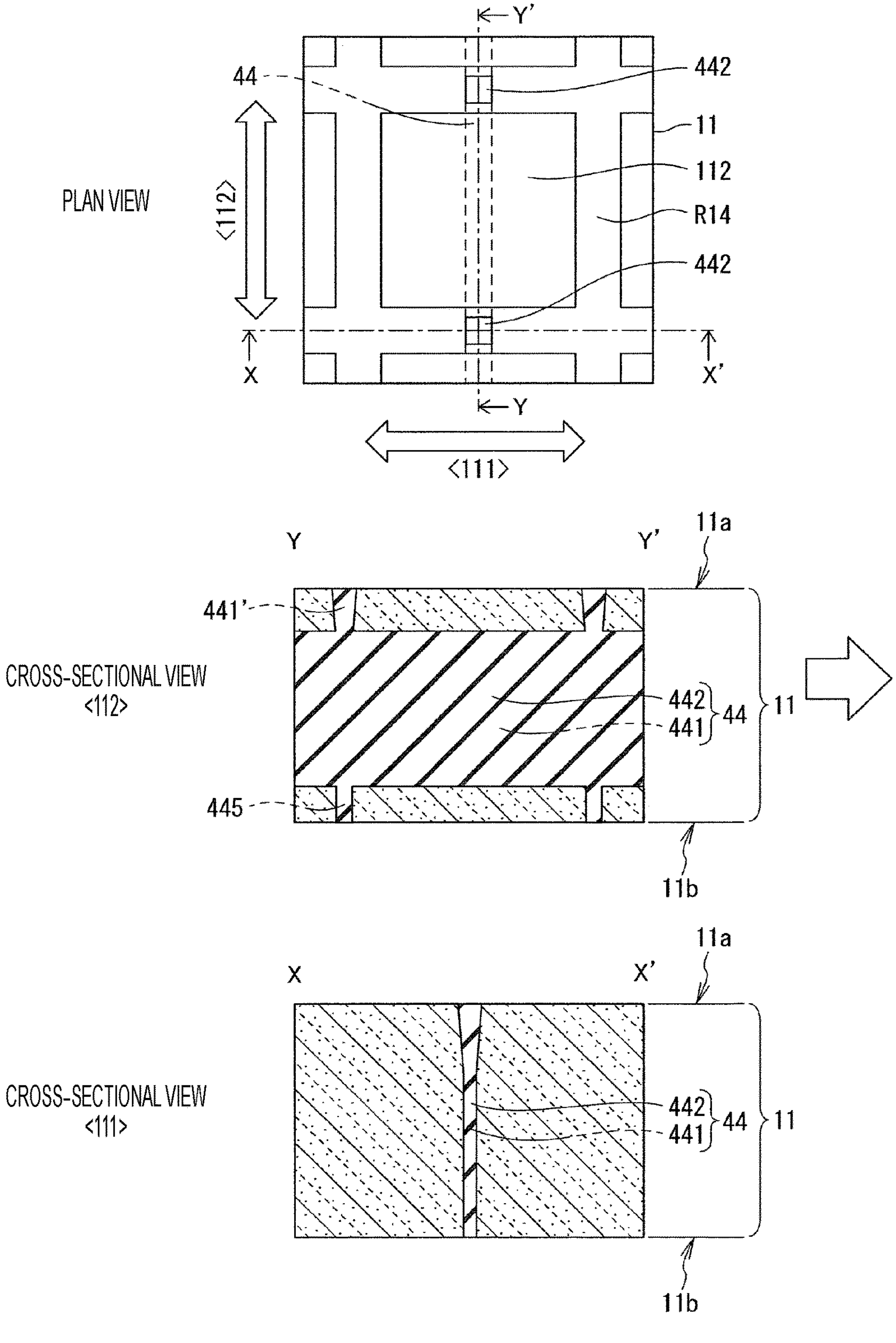
FIG. 26 is a view illustrating the manufacturing method for the intra-pixel isolation portion according to the third embodiment of the present disclosure in order of processes.

Next, as illustrated in FIG. 26, the manufacturing apparatus forms the buried film 442 in the hollow trench 441 including the openings 441' and the opening 445. Thus, the intra-pixel isolation portion 41 including the hollow trench 441 and the buried film 442 is formed. As described above, the type of the buried film 442 is not particularly limited, and is, for example, amorphous Si or the like having excellent embeddability. The method for forming the buried film 442 is also not particularly limited, and is, for example, a CVD method excellent in embeddability.

Thereafter, the manufacturing apparatus forms the inter-pixel isolation portion 14 and the like. Next, the manufacturing apparatus performs CMP processing on the back surface 11*b* side of the first semiconductor substrate 11 to adjust the thickness of the first semiconductor substrate 11 to a predetermined thickness. Then, the manufacturing apparatus forms the light shielding film SF (see, for example, FIG. 16) and the color filter CF (see, for example, FIG. 16) on the back surface 11*b* side of the first semiconductor substrate 11, and forms the on-chip lens OCL (see, for example, FIG. 16) on the color filter CF. Through such steps, the imaging device 100A as illustrated in FIG. 16 is completed.

Effect of Third Embodiment

As described above, the imaging device 100A according to the third embodiment of the present disclosure includes the intra-pixel isolation portion 44 that separates the inside of the sensor pixel 112 into one region and the other region. The intra-pixel isolation portion 44 includes the hollow trench 441. In a partial region (for example, the central portion) in the sensor pixel 112, the hollow trench 441 is separated from the front surface 11*a* and the back surface 11*b* of the first semiconductor substrate 11.

With this configuration, as compared with the case where the intra-pixel isolation portion 44 appears on the front surface 11*a* (for example, the light incident surface) of the first semiconductor substrate 11, it is possible to suppress light from hitting the intra-pixel isolation portion 44, and it is expected to suppress color mixing caused by incident light scattering. Moreover, since the intra-pixel isolation portion 44 has a hollow structure, a blooming path (including, for example, single crystal Si) from one region to the other region separated by the intra-pixel isolation portion 44 can be formed. Furthermore, since the formation of the hollow trench 441 chemically proceeds by wet etching, it is possible to suppress occurrence of crystal defects on the side surfaces of the hollow trench 441. Thus, the imaging device 100 can further reduce dark current and white spots caused by crystal defects.

OTHER EMBODIMENTS

As described above, the present disclosure has been described according to the embodiments and modifications, but it should not be understood that the description and drawings forming a part of this disclosure limit the present disclosure. Various alternative embodiments, examples, and operation techniques will be apparent to those skilled in the art from this disclosure. It is a matter of course that the present technology includes various embodiments and the like not described herein. At least one of various omissions, substitutions, or changes of the components may be made without departing from the gist of the above-described embodiments and variations. Furthermore, the effects described herein are merely examples and are not limited, and other effects may be provided.

Note that the present disclosure can also have the following configurations.

(1)

An imaging device, including:

a first semiconductor substrate;

a plurality of sensor pixels that is provided on the first semiconductor substrate and performs photoelectric conversion; and a trench provided in a depth direction of the first semiconductor substrate from a first main surface of the first semiconductor substrate, in which the first semiconductor substrate is a (110) substrate in which the first main surface is a (110) plane, and at least a part of a side surface of the trench is a (111) plane.

(2)

The imaging device according to (1) above, further including an inter-pixel isolation portion that is provided in the first semiconductor substrate and separates one sensor pixel and another sensor pixel adjacent to each other among the plurality of sensor pixels, in which the inter-pixel isolation portion includes the trench.

(3)

An imaging device, including:

a plurality of sensor pixels that performs photoelectric conversion; and an inter-pixel isolation portion that separates one sensor pixel and another sensor pixel adjacent to each other among the plurality of sensor pixels, in which the first semiconductor substrate is a (110) substrate in which a first main surface is a (110) plane, and a shape of each of the plurality of sensor pixels in plan view is a rhombus.

(4)

The imaging device according to (3) above, in which an angle of a first internal angle of the rhombus is 109.5°, and an angle of a second internal angle of the rhombus is 70.5°.

(5)

The imaging device according to (3) or (4) above, in which a first side constituting an outer periphery of the rhombus and a second side constituting the outer periphery and intersecting the first side are each parallel to a longitudinal direction of a crystal orientation <111>.

(6)

The imaging device according to any one of (3) to (5) above, in which the inter-pixel isolation portion includes a trench provided from the first main surface of the first semiconductor substrate in a depth direction of the first semiconductor substrate, and at least a part of a side surface of the trench is a (111) plane.

(7)

The imaging device according to any one of (1), (2), and (6) above, in which a bottom surface of the trench is a (111) plane.

(8)

The imaging device according to any one of (1), (2), (6), and (7) above, further including an epitaxial film embedded in the trench.

(9)

The imaging device according to any one of (1), (2), and (6) to (8) above, further including a light shielding film embedded in the trench.

(10)

The imaging device according to any one of (1) to (9) above, further including:

an uneven structure provided on the first main surface side of the first semiconductor substrate and arranged in the sensor pixel, in which at least a part of a surface of the uneven structure is a (111) plane.

(11)

The imaging device according to (1) above, further including:

an intra-pixel isolation portion provided on the first semiconductor substrate and separating an inside of the sensor pixel into one region and another region, in which the intra-pixel separation portion includes the trench, and in at least a part of the sensor pixel, the intra-pixel isolation portion is separated from each of the first main surface of the first semiconductor substrate and a second main surface located on an opposite side of the first main surface.

(12)

The imaging device according to any one of (1) to (11) above, further including:

a second semiconductor substrate bonded to the first semiconductor substrate, in which the second semiconductor substrate is a (100) substrate in which a facing surface facing the first semiconductor substrate is a (100) plane.

(13)

The imaging device according to (12) above, in which the second semiconductor substrate includes a transistor provided on a side of the facing surface.

(14)

A manufacturing method for an imaging device, the method including:

a step of forming a trench in a depth direction of a first semiconductor substrate from a first main surface of the first semiconductor substrate on which a plurality of sensor pixels that performs photoelectric conversion is provided, in which the first semiconductor substrate is a (110) substrate in which the first main surface is a (110) plane, and in the step of forming the trench, the first semiconductor substrate is etched along a (111) plane.

REFERENCE SIGNS LIST

11 First semiconductor substrate

11a, 21a, 110a Front surface

11b, 110b Back surface

11c, 141c Side surface

11ep Si epitaxy Layer

11ep_p p-type Si epitaxy layer

12 Sensor pixel

13 Uneven portion

14 Inter-pixel isolation portion

15 p-type region

15' Si epitaxy Layer

16 First interlayer insulating film
17 First wiring
18 Element isolation layer
19, 142 Fixed charge film
21 Second semiconductor substrate
22 Support substrate
26 Second interlayer insulating film
27 Second wiring
41 Intra-pixel isolation portion
41*d*, 141*d*, 441*d* Bottom surface
44 Intra-pixel isolation portion
51, 53, 55, 57, 59 Insulating film
100, 100A Imaging device
110 First substrate unit
112 Sensor pixel
113 Pixel region
120 Second substrate unit
122 Readout circuit
123 Pixel drive line
124 Vertical signal line
130 Third substrate unit
131 Semiconductor substrate
132 Logic circuit
133 Vertical drive circuit
134 Column signal processing circuit
135 Horizontal drive circuit
136 System control circuit
141 Trench
143, 442 Buried film
144 Light shielding film
210 Second substrate unit
271, 441, 441', 445, 531, 551, 571 Opening
441" Rhombic hollow trench
441 Hollow trench
AMP Amplification transistor
AMP-G Gate electrode
CF Color filter
FD Floating diffusion
L1, L11 First side
L2, L12 Second side
L11 First side
ML Metal wiring
OCL On-chip lens
PD Photodiode
PU Pixel unit
R14 Region in which inter-pixel isolation portion is formed
RST Reset transistor
RST-S Source
SEL Selection transistor
SF Light shielding film
TR Transfer transistor
VDD Power supply line
WE Well region
θ1, θ2 Angle
θ3 Inclination angle

The invention claimed is:

1. An imaging device, comprising:
a first semiconductor substrate;
a plurality of sensor pixels on the first semiconductor substrate, wherein the plurality of sensor pixels is configured to execute a photoelectric conversion;
a plurality of intra-pixel isolation portions on the first semiconductor substrate, wherein
each intra-pixel isolation portion of the plurality of intra-pixel isolation portions separates an inside of each sensor pixel of the plurality of sensor pixels into a first region and a second region, and
the each intra-pixel isolation portion includes a trench; and
a plurality of trenches that extend from a first main surface of the first semiconductor substrate in a depth direction of the first semiconductor substrate, wherein
each trench of the plurality of trenches is different from the trench included in the each intra-pixel isolation portion,
the first semiconductor substrate has the first main surface that is a first plane,
at least a part of a side surface of the each trench of the plurality of trenches is a second plane, and
the first plane corresponds to a (110) crystal plane and the second plane corresponds to a (111) crystal plane.

2. The imaging device according to claim 1, further comprising
a plurality of inter-pixel isolation portions in the first semiconductor substrate, wherein
each inter-pixel isolation portion of the plurality of inter-pixel isolation portions separates adjacent sensor pixels of the plurality of sensor pixels, and
the each inter-pixel isolation portion includes a trench of the plurality of trenches.

3. The imaging device according to claim 1, wherein a bottom surface of the each trench of the plurality of trenches is the second a plane.

4. The imaging device according to claim 1, further comprising an epitaxial film embedded in the each trench of the plurality of trenches.

5. The imaging device according to claim 1, further comprising a light shielding film embedded in a trench of the plurality of trenches.

6. The imaging device according to claim 1, further comprising:
an uneven structure on the first main surface of the first semiconductor substrate, wherein
the uneven structure is in the each sensor pixel of the plurality of sensor pixels, and
at least a part of a surface of the uneven structure is the second a plane.

7. The imaging device according to claim 1,
in a partial region of the each sensor pixel, the trench included in the each intra-pixel isolation portion is separated from the first main surface of the first semiconductor substrate and a second main surface of the first semiconductor substrate, and
the second main surface is located on an opposite side of the first main surface.

8. The imaging device according to claim 1, further comprising: a second semiconductor substrate bonded to the first semiconductor substrate, wherein
the second semiconductor substrate has a facing surface that faces the first semiconductor substrate, the facing surface is a third plane, and the third plane corresponds to a (100) crystal plane.

9. The imaging device according to claim 8, wherein the second semiconductor substrate includes a transistor on a side of the facing surface.

10. An imaging device, comprising:
a semiconductor substrate;
a plurality of sensor pixels on the semiconductor substrate, wherein the plurality of sensor pixels is configured to execute a photoelectric conversion;
a plurality of intra-pixel isolation portions on the semiconductor substrate, wherein each intra-pixel isolation portion of the plurality of intra-pixel isolation portions separates an inside of each sensor pixel of the plurality of sensor pixels into a first region and a second region, and the each intra-pixel isolation portion includes a trench; and a plurality of inter-pixel isolation portions in the semiconductor substrate, wherein each inter-pixel isolation portion of the plurality of inter-pixel isolation portions separates adjacent sensor pixels of the plurality of sensor pixels, and the semiconductor substrate has a first main surface that is a first plane, a shape of the each sensor pixel of the plurality of sensor pixels in a plan view is a rhombus, and the first plane corresponds to a (110) crystal plane.

11. The imaging device according to claim 10, wherein an angle of a first internal angle of the rhombus is 109.5°, and an angle of a second internal angle of the rhombus is 70.5°.

12. The imaging device according to claim 10, wherein a first side of the each sensor pixel constitutes an outer periphery of the rhombus, and a second side of the each sensor pixel constitutes the outer periphery of the rhombus, wherein the second side intersects the first side, the first side and the second side are parallel to a longitudinal direction of a crystal orientation corresponding to a second plane, and the second plane corresponds to a (111) crystal plane.

13. The imaging device according to claim 10, wherein the each inter-pixel isolation portion includes;

a trench that extends from the first main surface of the semiconductor substrate in a depth direction of the first-semiconductor substrate, and at least a part of a side surface of the trench is a second plane.

* * * * *